United States Patent [19]
Romerein et al.

[11] Patent Number: 5,638,035
[45] Date of Patent: *Jun. 10, 1997

[54] COAXIAL CABLE DISTRIBUTION NETWORK HAVING A REVERSIBLE DIRECTIONAL COUPLER

[75] Inventors: Robert L. Romerein; David B. Crowhurst; Zdenek J. Nepovim; Kenneth W. Lynes, all of Lindsay, Canada

[73] Assignee: J. E. Thomas Specialties Limited, Lindsay, Canada

[*] Notice: The term of this patent shall not extend beyond the expiration date of Pat. No. 5,635,881.

[21] Appl. No.: 426,232

[22] Filed: Apr. 21, 1995

[30] Foreign Application Priority Data

Apr. 20, 1995 [CA] Canada ................... 2147410

[51] Int. Cl.$^6$ ........................................ H01P 1/12
[52] U.S. Cl. .................... 333/101; 333/244; 333/105; 333/136
[58] Field of Search ........................... 333/100, 105, 333/127, 136, 244, 106, 101; 361/814, 823, 826; 455/4.2, 6.2; 348/6, 10

[56] References Cited

U.S. PATENT DOCUMENTS

| | | | |
|---|---|---|---|
| 3,800,222 | 3/1974 | Kowalewski | 333/105 X |
| 4,795,960 | 1/1989 | Malcolm | 333/105 |
| 4,963,966 | 10/1990 | Harney et al. | 380/52 X |
| 5,006,822 | 4/1991 | Reddy | 333/112 |
| 5,058,198 | 10/1991 | Rocci et al. | 333/109 X |

OTHER PUBLICATIONS

American Radio League, *AARL UHF/Microwave Experimenter's Manual*, 1st edition, pp. 5–9 to 5–15 & 7–47 to 7–51. 1980.
Harvey, *Microwave Engineering*, Academic Press, pp. 407–415. 1963.
Reddick, "One GHz Passives: Extending the Operating Frequency of Cable television Components", *Communication Engineering and Design*, pp. 36–38. Feb. 1992.
Samtec, *Sudden Solution Guide*, Catalogue F–193, pp. 46 & 59. Apr. 1993.

*Primary Examiner*—Benny Lee
*Assistant Examiner*—Justin P. Bettendorf
*Attorney, Agent, or Firm*—Dowell & Dowell

[57] ABSTRACT

A conducting housing (to be closed by a lid) for a coaxial cable distribution network has a common port and one of an aerial or pedestal port. A motherboard carries an RF circuit and a transfer switch. In one setting of the transfer switch the RF circuit connects a coaxial pin at the common port with a coaxial pin at the pedestal port. In the other setting the common port pin is connected to the aerial port pin. When the aerial port is used on a rectangular housing, a transmission line forms part of the RF circuit between the motherboard and the aerial port. The transmission is preferably a central conductor spaced over most of its length by air from an outer conductor in the form of an inverted U enclosing the central conductor on three sides. Preferably a ground plane on the back of the motherboard connects to the transmission line outer conductor to provide a path entry in the housing at both ends for ground currents generated by signals in the RF path.

24 Claims, 14 Drawing Sheets

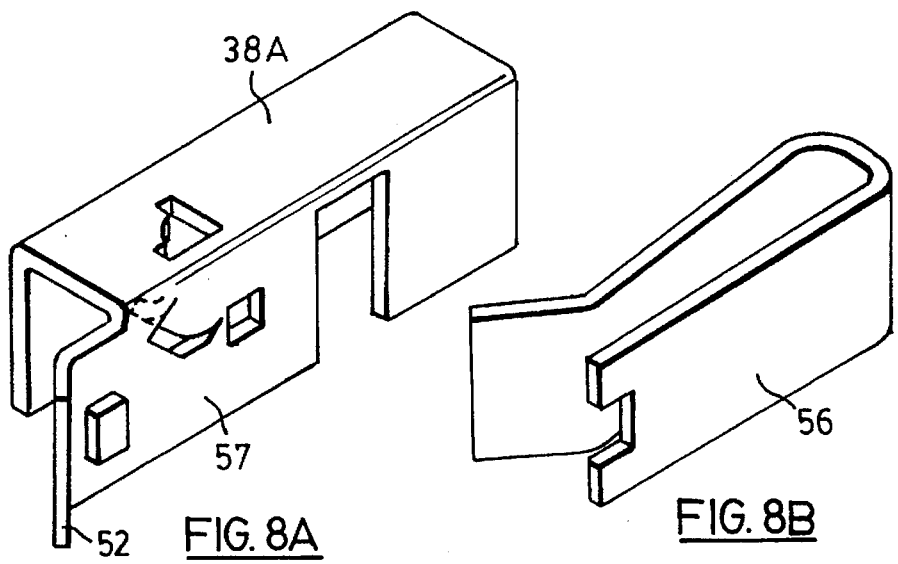
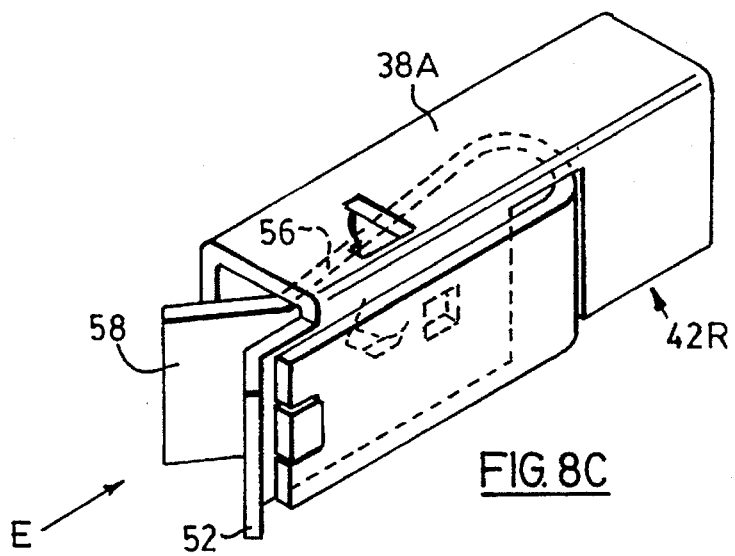
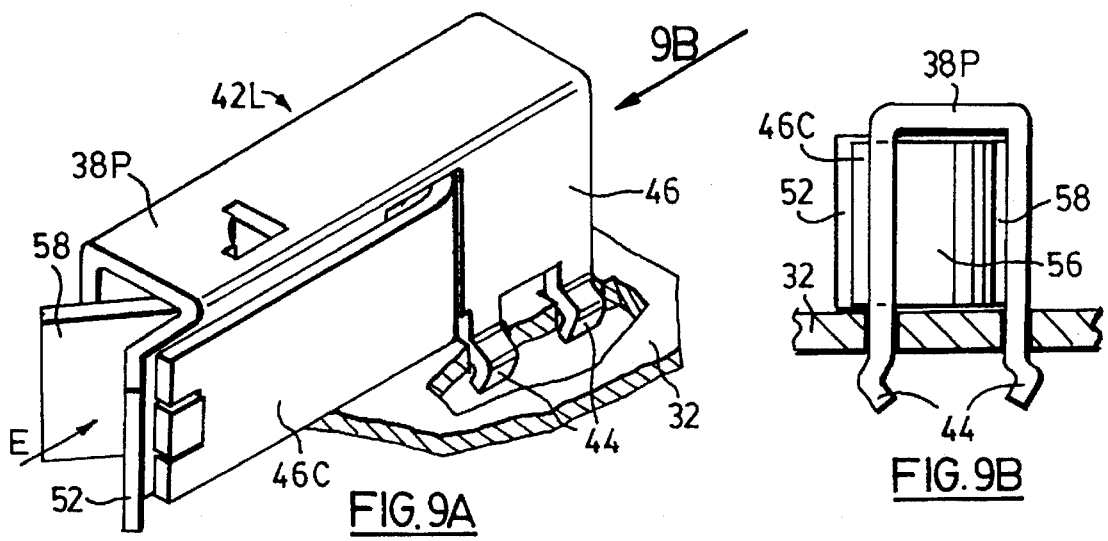

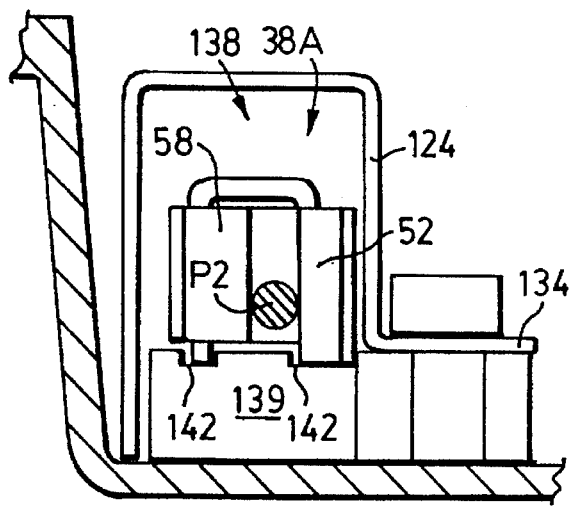
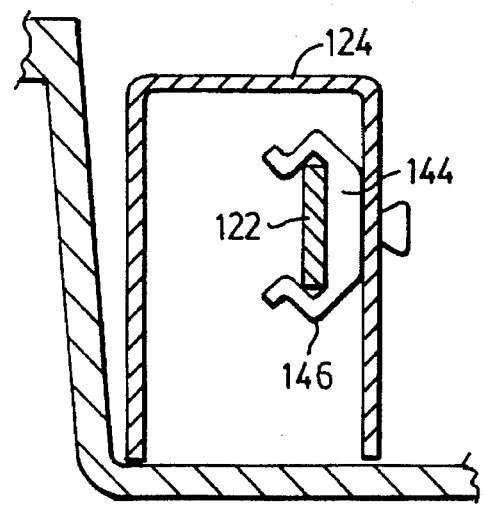
FIG. 10A  FIG. 10B
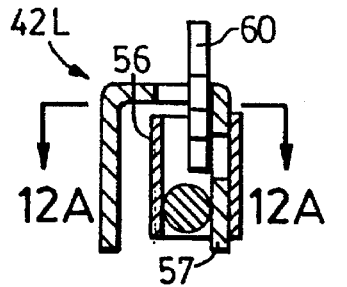
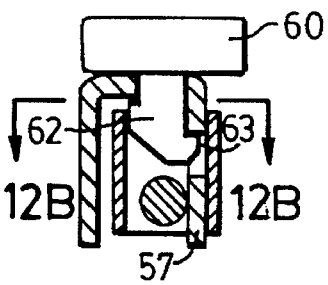
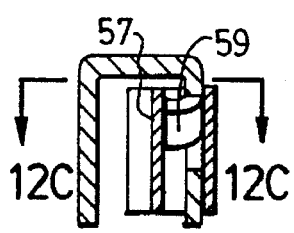
FIG. 11A  FIG. 11B  FIG. 11C
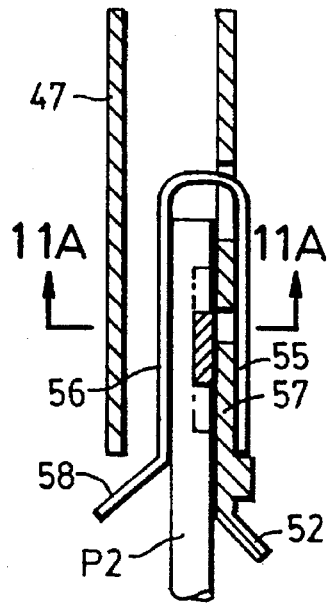
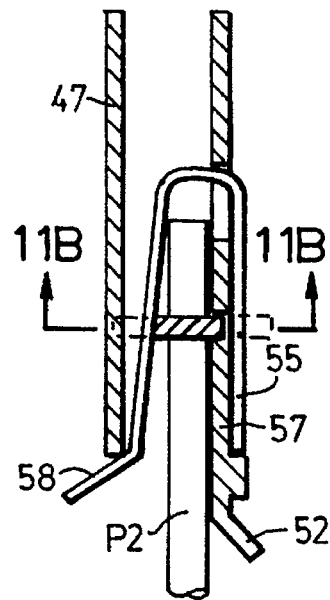
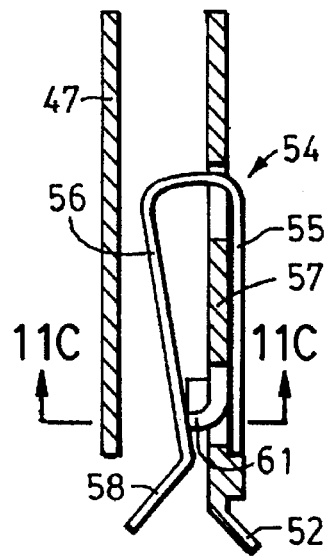
FIG. 12A  FIG. 12B  FIG. 12C

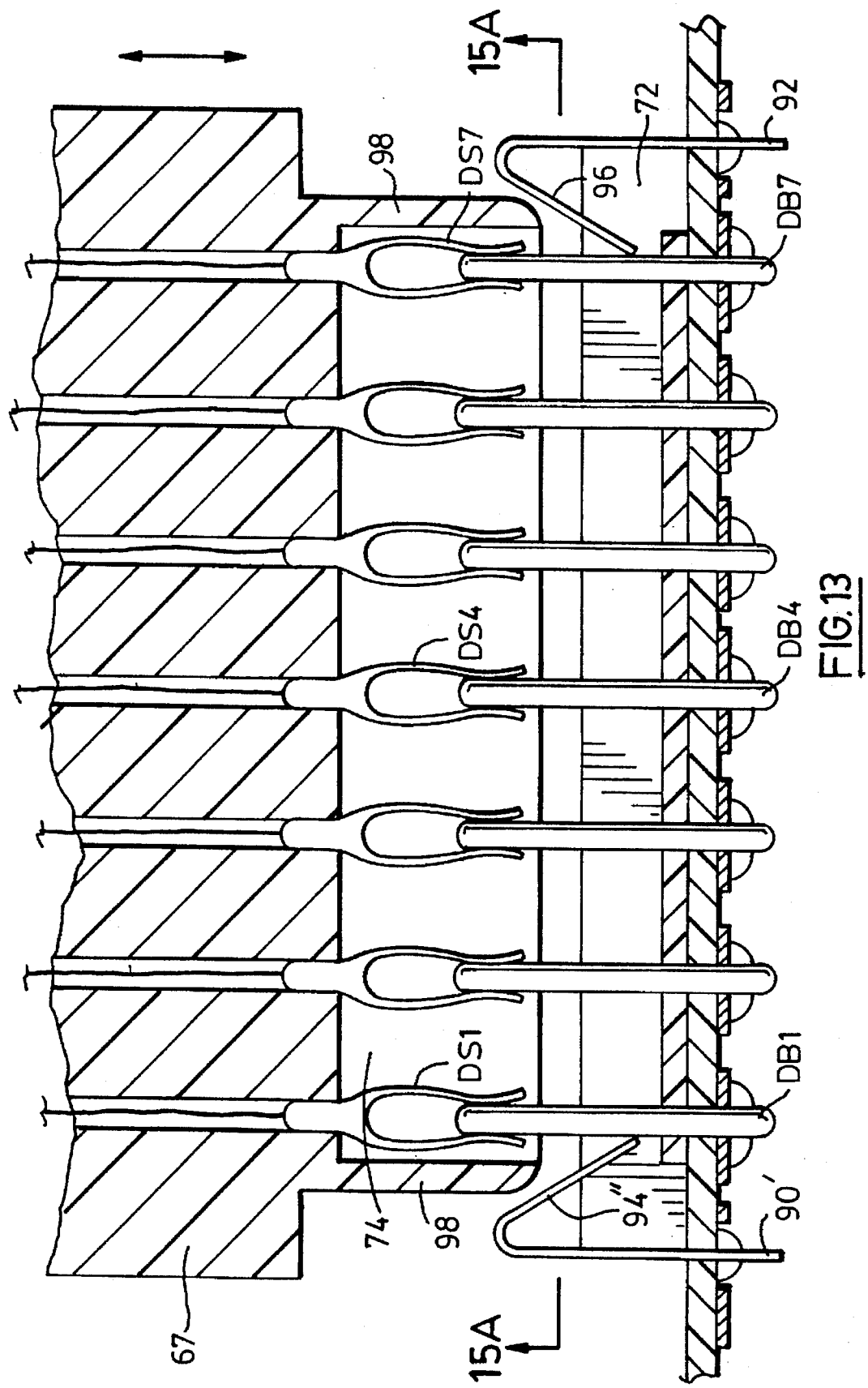

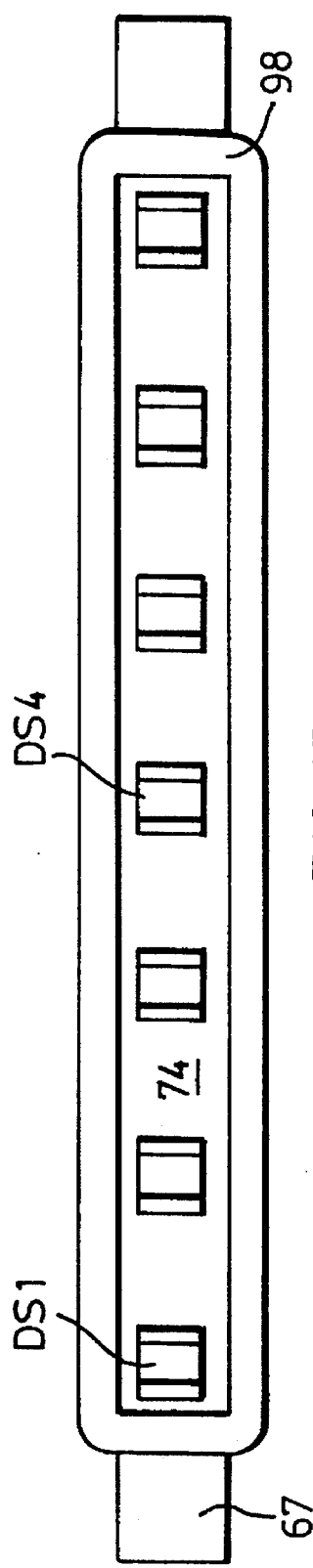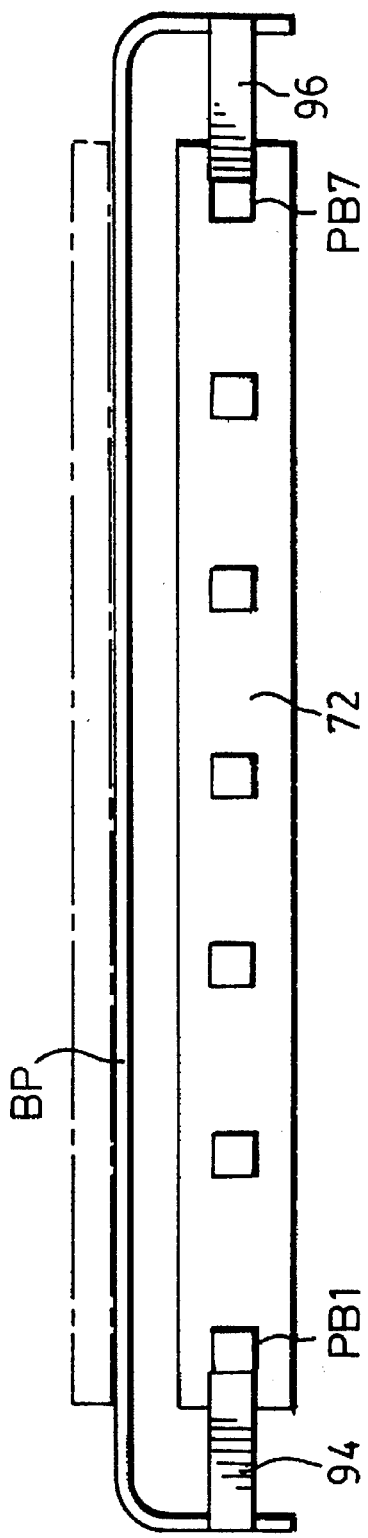

COAXIAL CABLE DISTRIBUTION NETWORK HAVING A REVERSIBLE DIRECTIONAL COUPLER

This invention relates to improvements in circuitry and the physical arrangement thereby for use in a housing for coaxial cable distribution networks. By the term 'coaxial cable distribution networks', I include Community Antenna Television (CATV) networks, Local Area (LAN) Networks, and other coaxial applications, including those carrying telephone signals particularly those which require broadband transmission.

In general the invention described herein may be usefully considered against the background of the components described in the following paragraph. However the individual inventions are believed to have applications in radio frequency ('RF')circuitry beyond the application in the following paragraphs. The circuitry herein is designed for RF signals of 5 Megahertz to 1 Gigahertz but is useful at higher and lower frequencies than this range.

BACKGROUND OF THE INVENTION

The background arrangement of components includes a conducting housing which has in one wall a common port CP and a pedestal port PP for respective connection to coaxial distribution cable, sometimes known as 'hard line' and in the opposed wall of the housing has an aerial port AP for similar connection. The invention however also applies to 'dedicated' two-port housings having only a common port and either an aerial or a pedestal port. A plate of insulating material, of the type commonly called a 'motherboard', carries RF and alternating current ('AC') circuitry and supports and is connected to the RF circuitry (commonly a coupler and splitter), for connection to customer ports, also known as 'secondary' or tap ports. There is an RF through path on the motherboard which is connectable at one end to the pin of the coaxial cable which is at the common port. The other end of the RF path on the motherboard is connectable to either the centre pin of a coaxial cable connected to the aerial port or the centre pin of a coaxial conductor connected to the pedestal port. An AC path (since the coaxial cable typically carries RF and AC) typically diverges from the RF to passthrough an inductor adjacent one end of such path and joins it again, near the other end of the RF path. The RF path (unless bypassed) connects to active or passive RF circuitry. Typical of the passive circuitry is a coupler and splitter for providing RF signals to the tap ports. The coupler is designed to operate on RF signals in only one direction in the path. Hence when, as is later discussed, the RF path through the housing is reversed, means must be provided for reversing the coupler relative to the remainder of the RF through line. The housing is usually one of a number connected in series with others at spaced intervals along lengths of coaxial cable forming part of the distribution network. It is undesireable if an RF through path is interrupted in one housing since it interrupts the reception of customers downstream in the distribution network. Bypass means are therefore provided if the coupler is removed.

GENERAL DISCUSSION OF INVENTIONS

The inventive features are discussed against the background of the preceding paragraph. However they can, at least to the extent discussed hereafter, be used in other environments than those discussed therein.

In one facet of the invention a novel terminal is provided for connection, on the one hand to the RF through circuit inside the housing and on the other hand to the centre pin of a coaxial conductor connected to one of the ports AP, PP or CP. (Typically such terminal will be used at each port). The 'centre pin' of a coaxial cable is used herein to include conventionally used additions or extensions to the coaxial central conductor, per se. The outer coaxial conductor is provided with a threaded nut, which is screwed on complementary threading on the outside wall of the housing, about the port. This has the effect of establishing an electrical connection between the outer coaxial conductor and the conducting housing while carrying the projecting end of the centre pin into the inside of the housing for contact with the terminal to be described. (The housing is open topped and closed by a lid). The terminal comprises a pair of opposed contact members (only one need be conducting although preferably both are) biassed toward each other to a closer spacing than the diameter of the centre pin and relatively movable against said bias to spacing greater than said diameter. The approximate path of relative movement of the contacts to each other is transverse to the insertion-withdrawal direction of the pin and transverse to the withdrawal or insertion direction of the terminal and attached components into and out of the housing.

The opposed contacts are aligned with the entry-withdrawal direction of the pin and provided with deflecting surfaces so that entry of the pin into the casing as a part of the attachment of a coaxial cable to the port, causes the pin to move the opposed contacts apart, so that, under the bias, they grip the pin between them, establishing electrical contact between pin and terminal. When the coaxial conductor is withdrawn from the port, the pin may slide out from between the contacts to allow them to assume their minimum spacing.

It is important to note that the cable may be attached and detached from the housing, making and breaking electrical contact between the pin and the terminal, without disturbing the circuitry inside the housing which is connected to the terminal contacts. In fact the pin and coaxial conductor may be withdrawn without opening the housing.

To attach the terminal contacts to the pin, means are provided for operation inside the open housing to spread the contacts, against the bias, to a spacing wider than the central pin diameter. At such deflection, the terminal and any components physically attached thereto may be moved toward the pin in a direction transverse to the pin, and to the relative direction of relative movement of the arms so that the contacts may be located on each side of the central pin. In this position, the means spreading the deflecting means may be released allowing the contacts to grip the pin and make electrical contact therewith. With a pair of contacts already gripping the pins the spreading of the contacts allows removal of the terminal and any equipment attached thereto from the housing—straight upwardly out of the casing, without disturbing the pin, which remains in place. Conversely, with the pin in place, and the terminal and its attached components, out of the housing, the spreader may be used to spread the contacts and the terminal and its attached equipment lowered into place with the contacts straddling the pin, so that the spreading means may be released to allow the arms or contacts to grip the terminal and make electrical contact.

It should be noted that the terminal may be removed from and replaced on the pin without detachment or disturbance of the pin or coaxial cable.

It should be noted that it is within the scope of the invention to design the opposed contacts and their biasses with guide surfaces operable on relative movement transverse to the pin and the bias direction so that they may be removed or removed and replaced from the terminal without the necessity of using the spreader.

In accord with another aspect of the invention an insulating plate or motherboard is provided for mounting in the housing and the RF through circuit is mounted thereon. The plate is commonly a flat thin layer of what is commonly known as printed circuit board ('PCB'). The plate is an insulator and is commonly constructed of a mixture of fibreglass and epoxy resin but may have different constituents and may be made from another insulating material such as molded plastic, cardboard or paperboard. Such insulating plates have a dielectric constant dependant on the material making up the plate. At the RF signal frequencies in the RF through circuit the RF signal strength dissipated in the plate will vary as the dielectric constant. The circuitry and associated components are designed to lessen such losses.

The RF frequencies' signals in the RF through path tend to interact with the conducting housing to produce eddy currents and standing waves in the housing. Such eddy currents and standing waves result in the loss of RF signal strength. It is of considerable importance to design the insulating plate and other RF circuit components described herein, to reduce the strength and incidence of such eddy currents and standing waves.

Accordingly, considerable design features are provided herein to reduce dependence on the dielectric qualities of the PCB and in reducing tendencies of the RF circuit or its physical environment to create currents in the housing.

The insulating plate customarily mounts the terminals for the common and pedestal ports and mounts or is connected to the terminal for the aerial ports.

The insulating plate provides the insulating support for the through portion of the RF circuit. The through line of the RF circuit is that portion which enters the housing at the upstream end (relative to signal flow in the coaxial distribution cable) and leaves at the downstream end. (It should be remembered that the housing and contained components are designed for signal flow in either direction through the RF through line).

In contrast to the through line there will be branch circuitry characteristic of that housing which will be normally connected to the through line. Most commonly the branch circuitry will comprise a coupler and splitter, for providing subscriber signals at the secondary or tap terminals. The presence and characteristics of the coupler and splitter have effects on the design of the inventions discussed. It will be noted that the coupler is undirectional. Hence its connections to the RF through line must be reversed if the RF signal direction along the through line is reversed. Moreover interaction between the signals of the branch RF lines and that of the through line must be reduced as far as possible as must currents in the housing due to branch line RF signals.

The coupler is directional and carries the RF main feed between RF main feed input and the RF main feed output terminals. The coupler further provides a tap output usually connected to the input of a splitter. When, in this invention, the coupler is installed, the coupler connection and components are connected between the main feed input and output terminals, they form part of the RF through path in the housing. The tap output does not. In accord with a preferred embodiment of the invention, when the coupler circuit is removed, the RF through path bypasses the coupler main feed input and output terminals.

Thus one end of the RF through line is connected to the terminal for the common port and the other end of the through line is connected to means, preferably a transfer switch, mounted on the insulating plate for selectively connecting the RF through line either to the terminal associated with the pedestal port or to the terminal associated with the aerial port. In this context the terminals are preferably, but not necessarily, in the form of the novel terminal described herein.

The transfer switch is preferably of the type having a rotary control knob. At 90° intervals about the axis of rotation, four terminals are provided. The transfer switch is designed to have a pair of bridging bars each having two-positions and at each position adapted to connect a different pair of the four terminals.

The transfer switch has four fixed contacts. One is connected to the end of the RF through line opposite to the end connected to the pin at the common port. The opposed contact is connected to ground through a resistor intended to have an impedance characteristic of the coaxial transmission line connected to the pedestal or aerial port. The other opposed contacts are respectively connected to the aerial and pedestal ports.

Thus in one position of the switch the end of the RF through path remote from the common port is connected by one bridge of the switch to the aerial port while the other bridge of the switch connects the (then unused) pedestal port to ground through the characteristic impedance resistor. In the other position of the switch the RF line is connected to the pedestal terminal and the aerial terminal is connected to the characteristic impedance resistor. The connection of the unused terminal to the housing reduces the incidence of harmonic or resonance effects in the otherwise unconnected lines particularly of such effects at such frequences as will correspond to or interact with RF signal frequencies.

The RF through line path across the insulating plate will tend to cause standing waves and eddy currents in the housing. To reduce such effects a first ground plane usually in the form of metal foil, located on the side of the insulating plate facing the housing, follows the RF through line circuit as far as possible across the plate. Thus the first ground plane is connected to the conducting housing adjacent the connection of the common port pin to its plate terminal. The ground plane contour then follows, at a determined spacing, the RF through path across the plate to a further connection to a housing wall adjacent to the point where the other end of the RF through path connects to the RF signal line beyond the boundaries of the insulating plate. The design effect is to provide that the impedance between the ground plane and adjacent portions of the RF through path which it accompanies, approximates the characteristic impedance. In this way interaction of the RF signal with the housing and the signal losses due to reflections and standing waves in the housing are greatly reduced.

In a preferred embodiment the first insulating plate also provides a coupler tap RF signal path from the coupler to the splitter input. A second insulating plate ground plane is contoured to accompany the tap-splitter signal path at approximately the characteristic impedance spacing. The second insulating plane is also contoured and located to reduce interaction between RF through line path signals and the tap-splitter path signals to reduce signal loss in either path due to the presence of the other. This particularly benefits the strength and integrity of the signal on the tap-splitter path in view of its large attenuation relative to the signal strength on the through path.

In some cases it is found that losses due to ground plane resonance are greatly reduced if the two ground planes are combined and strip TZ is conducting foil, joining ground planes GP1 and GP2 (FIG. 51).

The coaxial cables carrying signals to and from the housing, typically also carry alternating current ('AC'). There is therefore provided an AC bypass circuit, bypassing the RF through line interfaces with the coupler circuit. The AC and RF circuitry are specifically designed to reduce, to tolerable amounts, the AC in the RF circuitry and vice versa.

The CP and PP terminals are preferably mounted on the insulating plate as is the branch RF circuitry.

The insulating plate: with terminals, RF through line, AC bypass, transfer switch and mounting for the coupler and splitter; forms a platform or part of it which may be removed and replaced in the housing as a unit, thus reducing the 'downtime' caused by such repairs or replacements and reducing the interruption of service, not only to the subscribers served by connection to that housing but also to the subscribers downstream along the exit coaxial distribution line.

In the housing of generally square shape presently conventionally used the insulating plate will essentially be the platform, which may be removed and retained or replaced.

There has however come a need for a longer housing. When a housing which is connected to upstream and downstream distribution lines, has to be replaced, quite frequently the only practical way, is for the repairman to cut the coaxial cable on each side of the housing, adapt the cable ends for reattachment, and connect to the new housing. The shortening of the cable lengths renders them difficult to attach to the new housing. Accordingly, there has arisen the need for a longer box. With the common and aerial ports at opposite ends of what is generally a rectangular housing, an internal transmission line is required from the motherboard to the aerial terminal. This transmission line may be an internal (to the housing) coaxial line but the need for support for the central conductor introduces losses between the internal line central and outside conductors.

A trough line, where the outer conductor only partially encloses the inner allows an 'air line' where, except adjacent the ends, there is nothing but air between the conductors along the length. Whatever the internal transmission line used, the connection from the aerial port terminal to the motherboard including the internal transmission line is preferably rigidly connected to the insulating plate, forming, within the long housing, a part of the platform, including the motherboard, for removal from or replacement in the housing, as a unit.

Although the bypass switch is used herein to bypass the coupler circuit as part of the RF through line, the bypass switch may be used in other RF circuitry than that specifically described herein.

In accord with this aspect of the invention, two probes for connecting the RF through the coupler interface circuitry, are located on the motherboard. In accord with well known coupler design the coupler circuitry requires one probe for an RF (through line) input and the other probe for an RF through line output. (These probes are in addition to additional probes including an output to the splitter.) In accord with a preferred aspect of the invention the coupler circuitry is mounted on insulated plate preferably of the same constituency as the first. The second plate is sometimes called a 'daughter board' and is separable from but mounted on the motherboard.

The first insulating plate mounts a row of upstanding probes corresponding to the through line, accessory and splitter connections required. The RF through line probes are at each end off the row. The second plate mounts a complementary pattern of sockets which may be moved as a unit onto the probes. As the second insulating plate approaches the probes, the RF first insulating plate end probes electrically connect to the corresponding end (RF through path) sockets mounted on the second insulating plate, a certain distance from completely assembled position. On movement away from assembled position the RF through line probes and sockets of the two boards break contact at the same certain distance. With the second insulating plate removed from the first, two spring contacts the first plate make respective contact with the RF through line probes. These spring contacts are connected to a conductor on the first plate which bypasses the RF probes and has the effect, when connected to the RF through line probes, of completing the RF through line along, the bypass thus ensuring carrying of the RF signal to housings and their subscribers downstream from the housing in question, even though the second insulating plate is absent.

The second insulating plate is provided with insulating members which move with the second plate sockets toward and away from the first plate. These insulating members are located and dimensioned to make or break electrical contact between the spring contacts and the RF through line probes at a point closer in the member spacing from completely assembled position than the make break-point between the probes and sockets. Thus on relative separating motion of the second plate, the bypass connection for the RF motherboard circuit is completed before the RF connection to the daughter board is broken. On relative assembly movement, the RF connection to the daughter board is made before the bypass connection is broken. Thus whether the second plate connection is being completed or interrupted the RF through line is never disconnected and service to downstream housings and end users is not interrupted during removal of the second plate.

BRIEF DESCRIPTION OF THE DRAWINGS

In drawings which illustrate a preferred embodiment of the invention:

FIGS. 8A, 8B and 8C show the construction of a terminal for use at the aerial port, FIGS. 9A and 9B demonstrate the construction of a terminal for use at the common or pedestal ports, FIGS. 10A and 10B demonstrate the trough line mounting adjacent the aerial port, FIGS. 11A, 11B and 11C are vertical sectional views demonstrating the operation of a terminal, FIGS. 12A, 12B and 12C are horizontal sectional views demonstrating the operation of a terminal, FIGS. 13 and 14 demonstrate the operation of the make before break switch, FIGS. 15A and 15B show side and top views, respectively, of the bypass circuit.

DETAILED DESCRIPTION OF THE PREFERRED EMBODIMENTS

Figure 1:
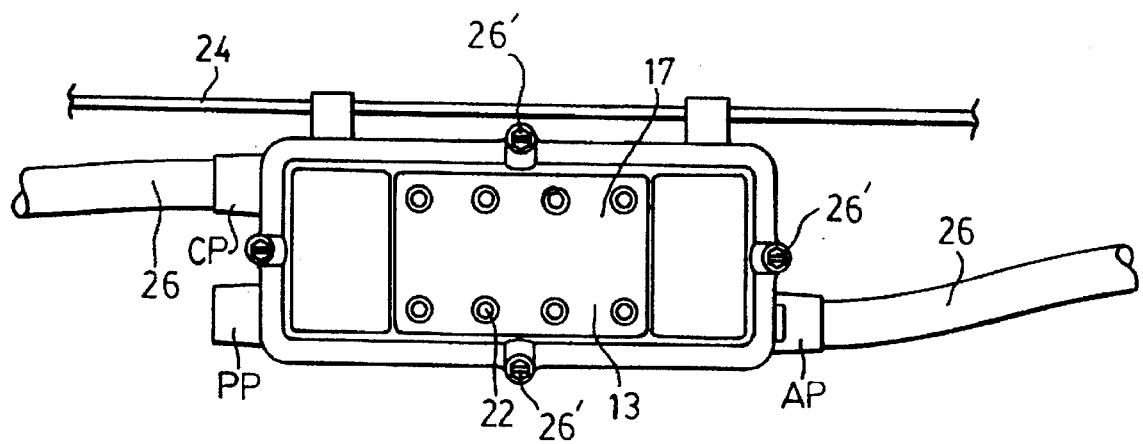
FIGS. 1 and 2 show housings in accord with the invention, with lids applied, on aerial and pedestal mounts, respectively.

In the drawings is shown a 'long' housing 10 of generally rectangular shape having opposed end and side walls 14 and 16, respectively, (see FIG. 3) and four bosses 12 for lid 16 attachment by bolts (see FIG. 1). The housing is generally rectangular and has ports as now described in the opposed narrow ends. The housing is longer than conventional present day housings. End bosses 12 designated 12L and 12R of different heights, cooperate with complementary lid 17 shapes, not shown, to ensure that the lid may only be applied one way.

Most of the elements and features shown, with the notable exception, of the trough line, are equally useful with a square housing.

It is convenient herein to refer to the 'left' and 'right' ends of the housing, to its 'top' and 'bottom' and to the 'near' and 'far' sides. This refers to the orientation of FIG. 3 and is only for convenience of description and in actual use the designation left, right, near, far etc. may not describe the actual physical locations or directions.

At the left hand end of the housing there is a common port CP and a pedestal port PP. At the opposite end of the housing there is an aerial port AP. At each of these ports, a boss 18 with threading (not shown) receives a connector which has complementary threading designed to mechanically and electrically connect the outside conductor of the coaxial distribution cable to the housing which is electrically conducting.

By 'coaxial cable' herein, unless otherwise specially qualified I mean the distribution coaxial cable or 'hard line' which extends between 'multitap' housings. By 'multitaps' I mean a housing similar or performing a similar function to the one described herein, which distributes a small fraction of the RF signal to individual cable subscribers on 'drop' lines from secondary or tap ports which receive the output of the splitter in the housing. FIG. 1 shows an aerial mounting for the housing and FIG. 2 a pedestal mounting. Eight tap ports 22, without drop lines attached are shown in FIGS. 1 and 2.

In accord with conventional coaxial cable design, (FIG. 4 and FIGS. 11A–12C a pin, electrically connected to the center conductor of the cable, projects beyond the fitting of the outer conductor and on connection of the outer conductor to the housing, the pin will project through the end wall of the housing for connection to the circuitry therein. Many variants of such pins are known in the CATV industry and in some cases the pin may be part of an extension fitting which connects to the central conductor proper. All such pins, forming an electrical extension of the central conductor proper should operate with the invention described herein.

FIG. 1 shows a housing 'aerial mounted' on a line 24 with coaxial cable 26 connected at port CP and at port AP. It will be noted that the port PP is not in use.

Figure 2:
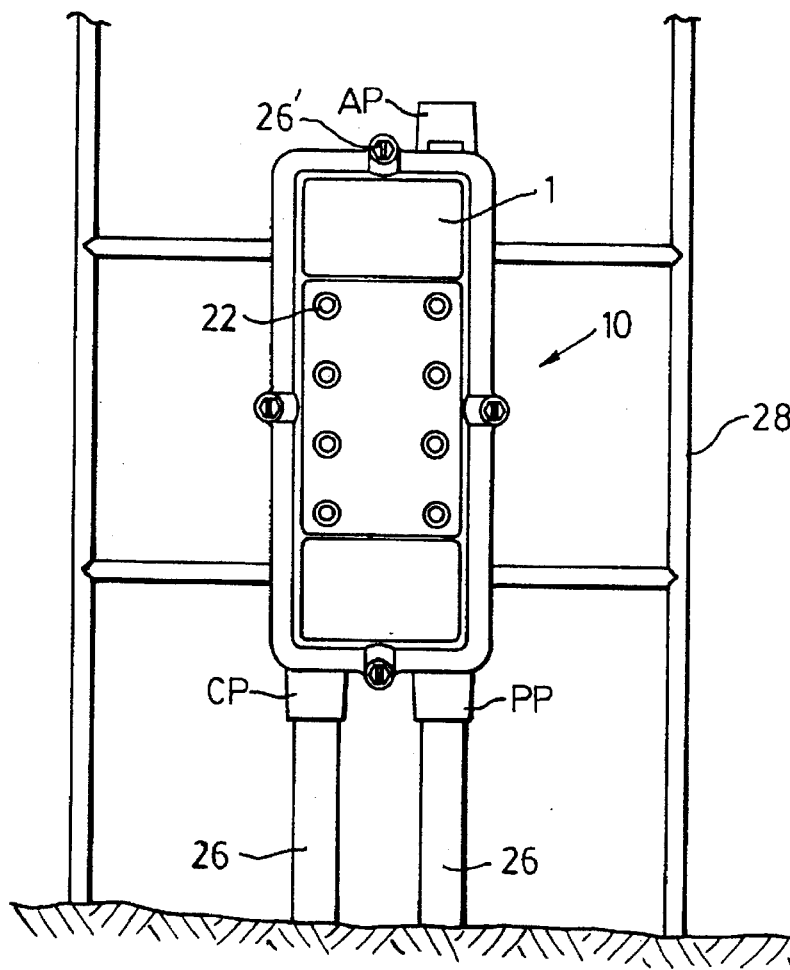

FIG. 2 shows a housing 'pedestal mounted' on a frame 28 with coaxial cable 26 connected to ports CP and PP. It will be noted that the port AP is not in use.

Not shown in FIGS. 1 and 2 are the drop lines which would normally be connected to the tap ports 22.

By RF signal direction along a line 26 or through a housing 10 I mean the direction of the main RF signal which is of much higher frequency than any reverse RF signal. AC power is frequently also carried on the cable 26.

RF signal direction may be in either direction through the housings described herein.

Figure 3:
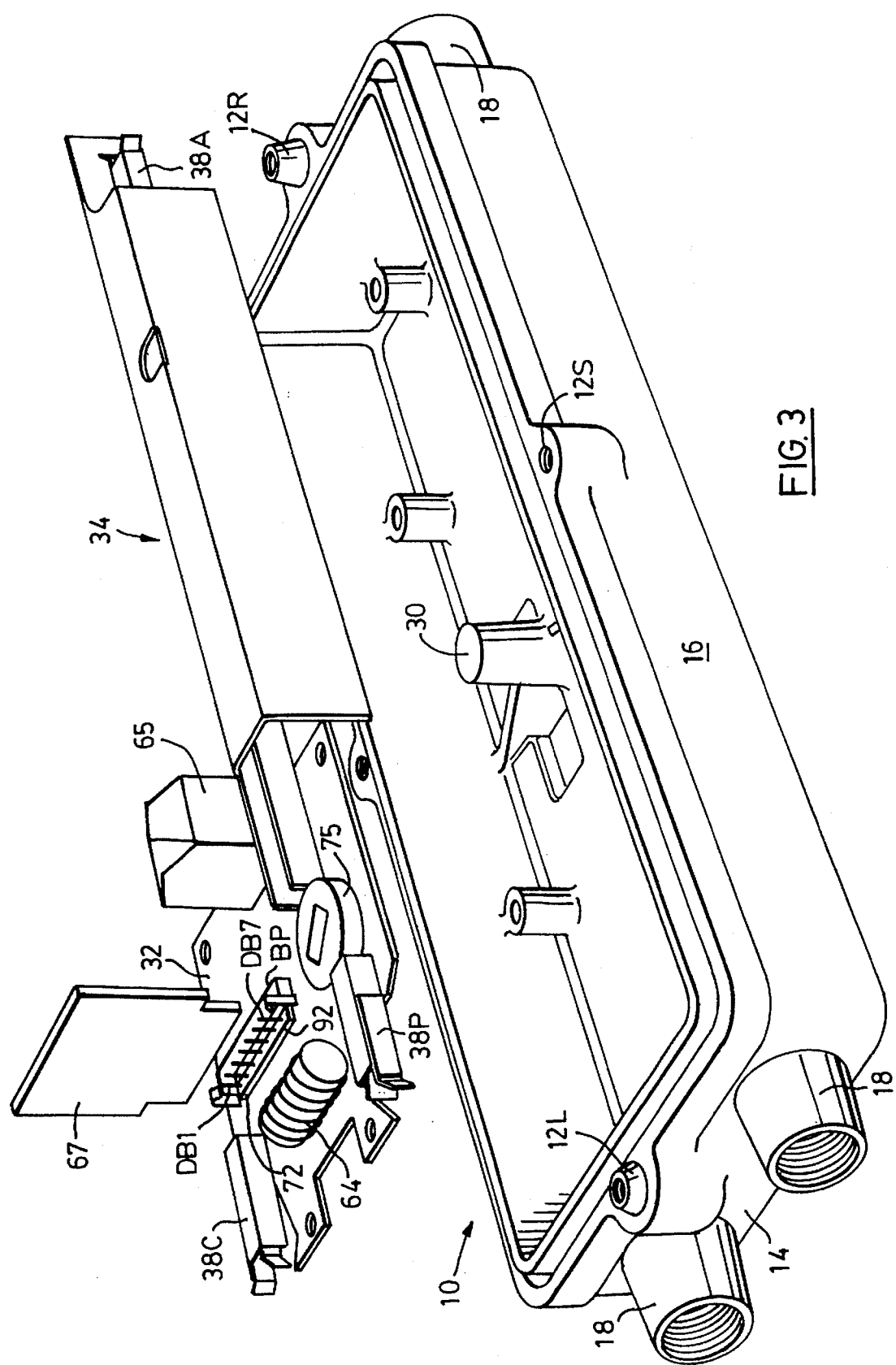
FIG. 3 is an exploded view of the housing showing the platform and the general arrangements of the components mounted thereon, but omitting the electrical connections and paths.

In the housing of FIG. 3 are four bosses 12 for lid attachment by bolts 26. (See also FIGS. 1 and 2) 12L and 12R are differently raised so the housing must be put on the right way. Centrally of the housing is main boss 30 for attachment of the housing to an aerial or pedestal mounting bracket.

A platform comprising generally rectangular first insulating plate 32 (commonly called a motherboard) with attached internal transmission line (called herein a trough line 34) is adapted for mounting on the housing by bolts in platform bosses PB1–PB8 numbered clockwise (FIG. 4) and PB9. The motherboard and trough line are preferably a permanently connected unit and fastened to the platform bosses by bolts and the platform is preferably therefore attachable or removeable as a unit.

On opposite sides of the left edge of motherboard 32 are the terminals 38C and 38P (FIGS. 1, 2, 6 and 7).

Figure 4:
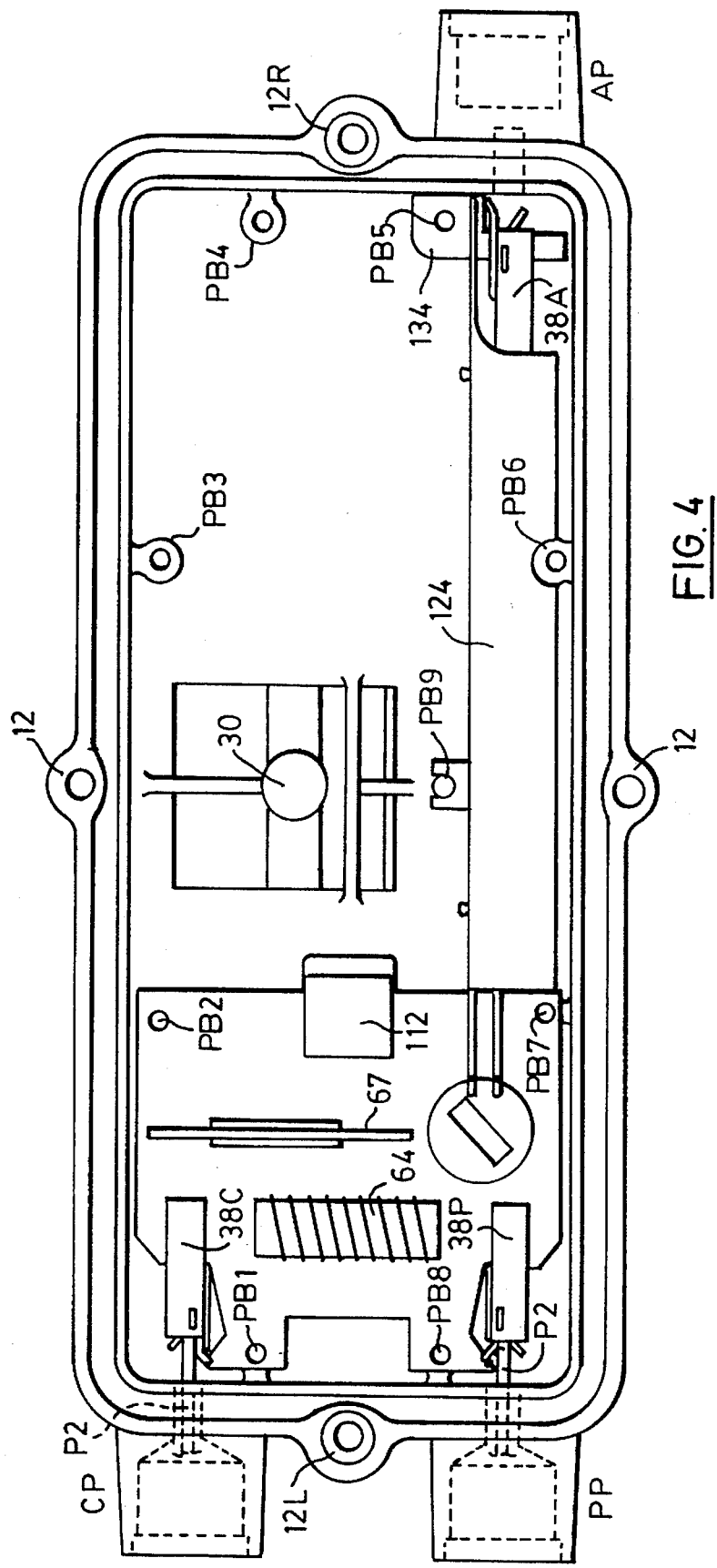
FIG. 4 is a plan view of the housing with platform attached but omitting the electrical connections.

As noted the motherboard 32 is cut away at its left hand corners, adjacent the CP and PP ports, (FIGS. 3 and 4) so that it may, as described hereafter, be lifted upward out of the housing from below to above the respect ire inwardly projecting coaxial cable pin P2 (FIG. 4). For taunting the terminals 38C or 38P on the board 32 there is provided an inverted U-shaped conducting bracket 42L which has downwardly extending tabs 44 for attachment to the board and electrical connection to the RF through line to be described. The side walls 46–57 of each of bracket (as shown in FIGS. 9A, 9B) are provided with four downwardly projecting legs which are provided at their free ends with ends 44 bent in end section to be clipped into apertures in the motherboard. Solder is used on the underside of the motherboard to otherwise fix the bracket 42L (FIG. 9A) in place thereon. (Other modes of attachment may be used.) Foil 48 (FIG. 5) on the underside of the motherboard electrically connects bracket 42L with a capacitor 50 and with AC coil 64. The bracket 42L is dimensioned to project leftwardly of the motherboard to straddle the entrance axis E FIGS. 8C and 9A) of the pin with one (here the inside) of the bracket walls extending leftward beyond the other to provide at its leftward end an outward (relative to the other wall in horizontal section) a guide surface 52 shaped to tend to guide an entering pin toward the other bracket wall. A leftward extending clip 54 has in horizontal section, (FIGS.

12A–12C) a wall 55 fastened to the outside of wall 57 a hairpin turn at its rightward end and a resilient free clip wall 56 extending generally toward the pin and, in its rest state, sloping inwardly to overlap the pin entrance point. The leftward end of the clip wall is shaped in horizontal section to form a guide surface 58 slop trig away from the guide surface 52. The right hand bracket. 38A (see FIGS. 8A–8C) is identical to 38C and 38P except that it omits attachment tabs 44.

The result is that an entering pin P2 comes in contact with the guide surfaces 52, 58 and deflects the clip wall 56 from its rest position to allow the pin P2 to make good electrical contact with clip 56 and wall 57. If the pin is withdrawn the clip returns to its rest position. Only one of the interacting clip and bracket wall need be a conductor but more certain electrical contact is made if both are. Thus clip 56 and wall 57 act as the terminal's electrical contacts.

It will be noted therefore that the pin P2 with its coaxial connector may be attached to and detached from the mechanical and electrical connection to the terminal, without any movement of the bracket or indeed the necessity of opening the casing.

It will be noted that surfaces of the clip 56 and wall 57 extend generally perpendicular to the motherboard in areas adjacent their contact with the pin. This perpendicularity is designed, in combination with the spreader means to be described, to allow vertical removal and attachment of the clip and contact wall into and out of contact with pin P2, without the necessity of removing or adjusting the coaxial cable and pin P2.

In the cross bar of a U-shaped bracket 42R or 42L, there is provided, a key 60 rotatably mounted to rotate about a vertical axis. The key is designed to include a vane 62 and guide edge 63. When the clip 56 is in rest position (FIG. 12C) or resiliently deflected by the pin (FIG. 12B), the guide edge and vane extend parallel to wall 57), in inoperable position. When it is desired to deflect the clip 56 to a spacing from the bracket wall 46 wider than the pin P2 diameter, the vane is rotated by the key handle and is designed to frictionally engage the clip 56 surface to hold it in spread position. With the clip 56 in spread position, the terminal 38 may be moved vertically to or from its position straddling a pin P2. With the platform comprising motherboard and trough line as shown in FIG. 12, there will be terminals 38 at the CP, AP, and PP ports and that of the CP terminal and of one of the others, will be in use. With such two terminals engaged to pins P2, the motherboard-trough line platform may be lifted vertically out of the housing, or inserted vertically into the housing with the two terminals corresponding to pins P2 to straddle the pin, without the necessity of removing or otherwise disturbing the pin and coaxial cable attachments at the respective ports. The use of the key is proposed for both removal and attachment. However it is within the scope of the invention to merely slide the terminal contacts off the pin when removing them and to use the spreader key when placing the contacts in straddling position when applying them.

Moreover it is within the scope of the invention to provide the lower edges of clip 56 and wall 57 with downwardly diverging guide surfaces which will allow a terminal 38 to be moved downwardly into contact with a pin P2, and be spread by the pin itself so that, in the latter design, the key 60 is not required to spread the contacts.

Wall 57 is preferably provided with a tab 61 bent to project toward clip 56 and, in the absence of a pin to retain clip 56 at less than pin spacing but under slight bending stress to avoid its casual movement.

Other terminals than the preferred terminal, just described may be used. Such other terminals will preferably allow vertical removal of the terminal from the housing; permanent mechanical connection to the motherboard; and permanent electrical connection to the RF path.

The motherboard 32 also referred to as the first insulator plate, is of generally rectangular form and occupies the housing to the left of main boss 30. The motherboard is cut away at the two left corners to clear pins P2 at ports CP and PP and with a rectangular cut out on the left side facing the left housing wall between platform bosses PB1 and PB8. A central, short, rectangular extension 112 on the right hand edge of the motherboard is located to support the splitter interface 65 (FIG. 3). The motherboard must be of relatively thin insulating material preferably of epoxy resin and glass fibre but may be made of other insulating materials. The material of the motherboard will cause signal losses in the RF circuit. Expense must be balanced against RF losses in the selection of such insulating materials. As shown, the motherboard will be mounted on platform bosses PB1, PB2, PB7, PB8 by bolts, not shown, bolted into the bosses.

The circuitry and components are provided as in FIGS. 5–7 and 18 which show the top of the motherboard. The terminal 38C is electrically connected through capacitor C1 (FIG. 6) to daughter board probe DB1 by foil conducting extent F1 on the bottom of the motherboard. The daughter board 67 is a second plate of insulating material and will usually be the same material as the motherboard. All foil conducting extents are on the bottom of the motherboard. Daughter board probe DB1 is, as hereinafter described, connected to probe DB7 through the coupler circuit on the daughter board, to be described later, or through the bypass BP, determined as hereinafter described. Bypass BP is at its other end connected to daughter board probe DB7. (Daughter board probes DB1 to DB7 are mounted on the motherboard and will act to mechanically mount the daughter board thereon and to electrically respectively connect to daughter board sockets DS1–DS7. (If the daughter board is reversed relative to the motherboard because of a reversal of RF signal path then probes DB1–PB7 will be respectively connected to daughter board sockets DS7–DS1.)

Probe PB7 is connected along foil extent F2 to condenser C2 whose other side is connected to fixed terminal A of the transfer switch TS.

The Ac circuit is connected from the bracket 38C to one side of the power coil 64 whose other side is connected to foil extent F3 which is in turn connected to terminal A of the transfer switch TS. The power coil may also be permanently connected to terminal A.

The transfer switch has also terminal B connected to the central conductor 122 the trough line TL and the other end is connected to the terminal at port AP.

Figure 6:
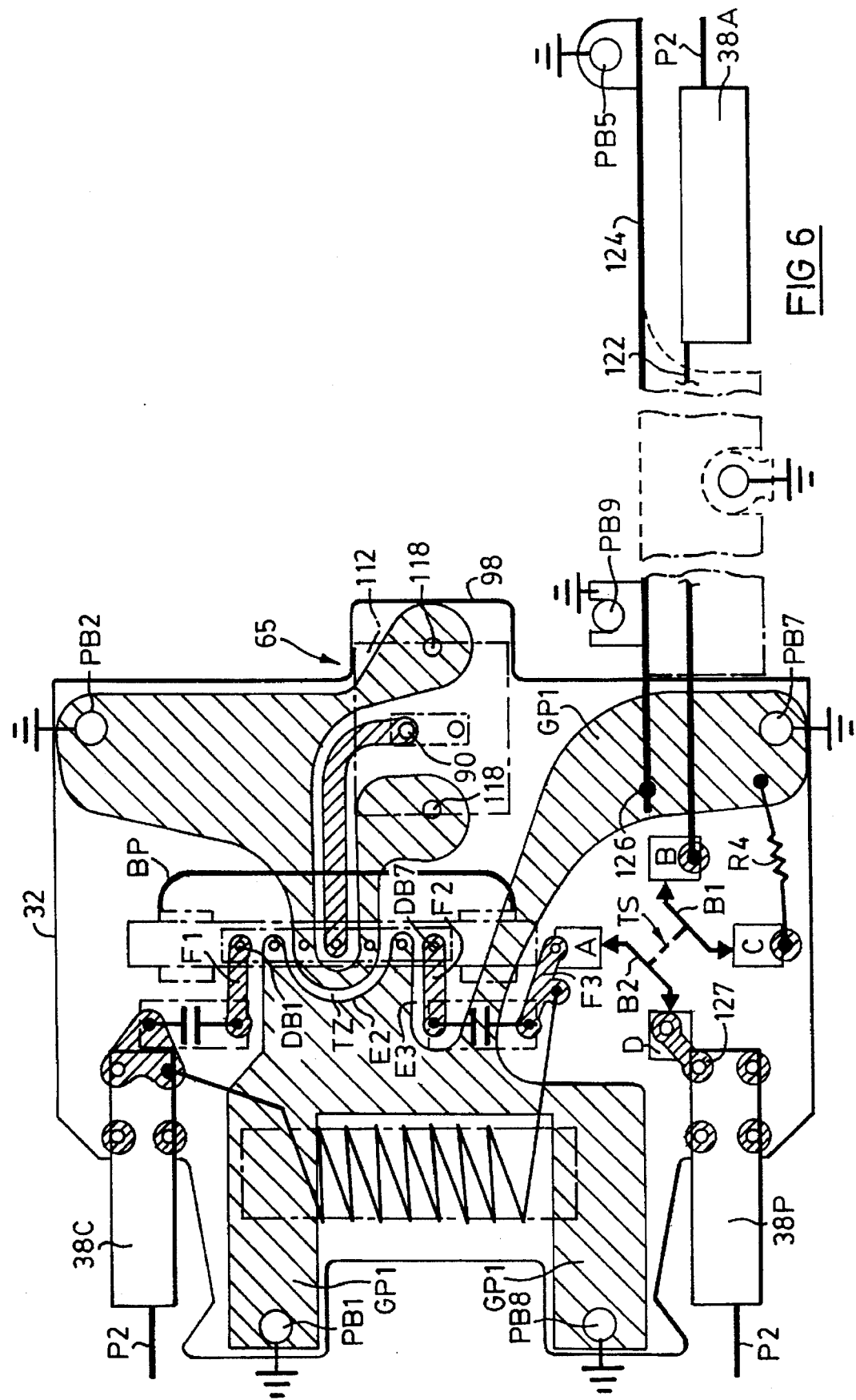
FIGS. 6 and 7 are plan views showing the platform circuit with the transfer switch positioned for pedestal and aerial mount, respectively.
Figure 7:
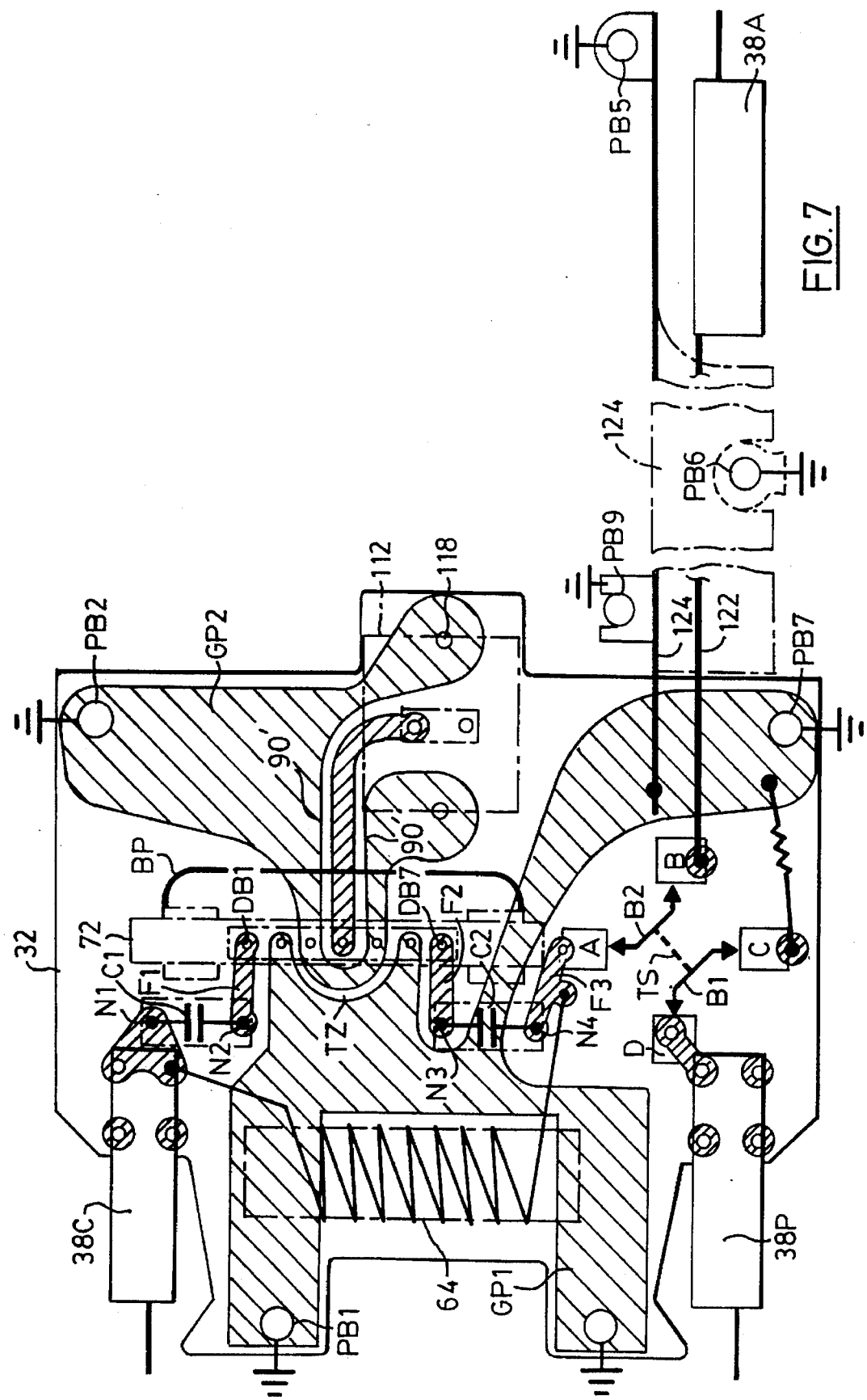

Terminal C of the transfer switch is connected to the housing at boss PB7 through resistor R4. The connection of resistor R4 to boss PB7 may be through ground plane GP1, as shown in FIGS. 6 and 7 or alternatively through the outer conductor of trough line 34. Resistor R4 is of the characteristic resistance between the coaxial distribution cable 26 inner and outer conductors, usually 75 ohms.

Terminal D of the transfer switch is connected to the terminal 38P at port PP.

Thus the RF circuit over the motherboard is from CP terminal 38C, across condenser C1 over foil extent F1, to daughter board probe DB1. From DB1 to DB7 the RF circuit may go through the directional coupler on the daughter board to DB7 or may go to DB7 through the bypass BP.

From DB7 the RF circuit goes over F2, C2 and F3 to terminal A. The RF signal may go across the motherboard in the opposite direction in which case the daughter board connections are reversed so that DB1 is connected to daughter board socket DS7 and so on.

The AC coil connects to terminal 38C and to terminal A. The AC coil is selected relative to the RF path to allow only a controllable proportion (usually small) of the AC power coming in on the distribution cable to be delivered to the directional coupler circuit. If desired for achieving a different proportion capacitors C1 and C2 may be omitted. However if C1 or C2 is omitted, then a capacitor should be placed in bypass circuit BP. In the absence of C1 or C2 the added capacitor will avoid the shorting out of the AC power coil by the bypass, when connected.

The rotary transfer switch TS is a two position switch having diametrically opposed connector bars. In one position (when aerial port AP is used) bar B2 will connect terminals A and B and the bar B2 will connect terminals C and D. In the other position (when the pedestal port is used) bar B2 will connect terminals D and A and the other bar will connect terminals B and C.

Figure 5:
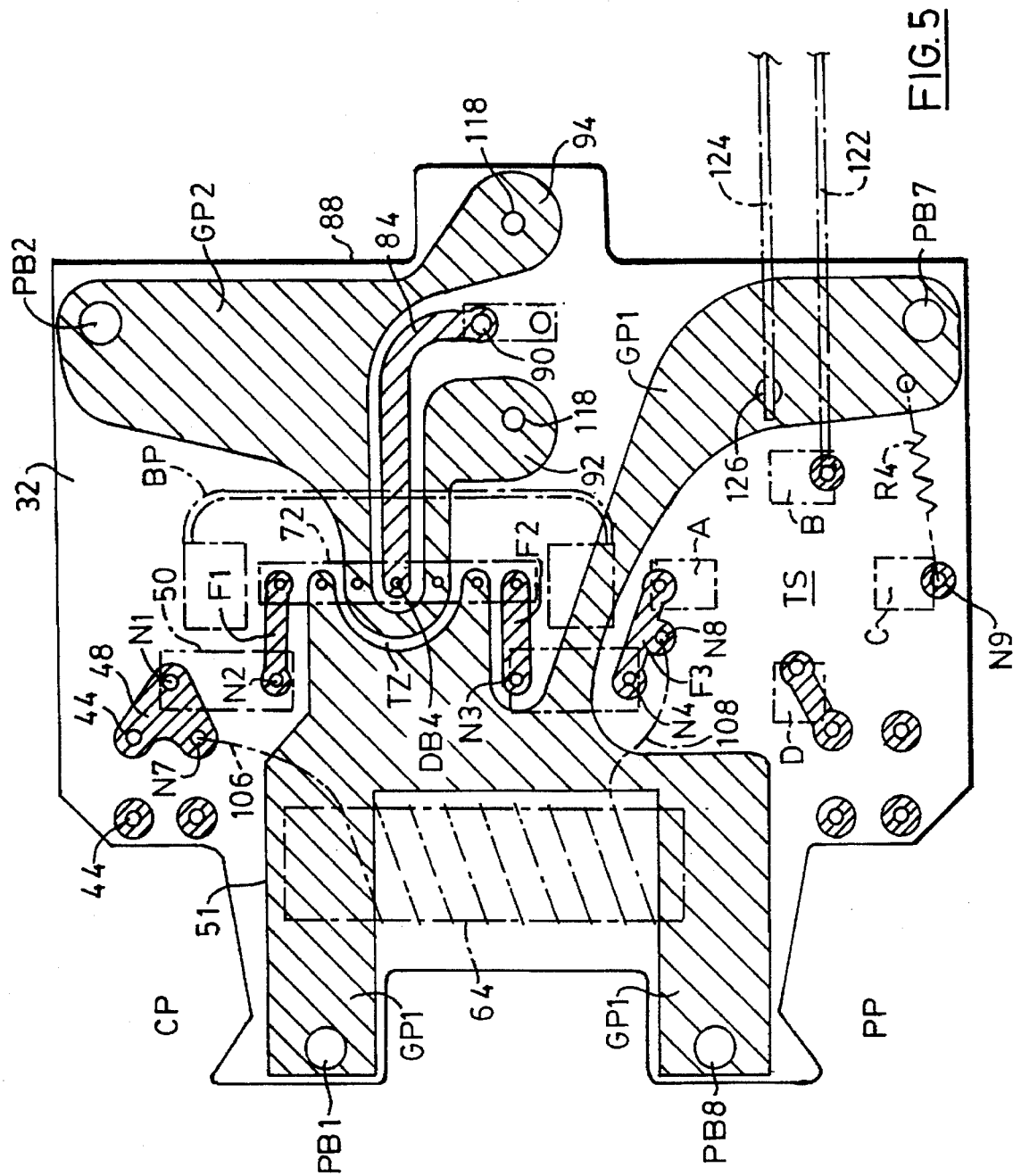
FIG. 5 is a plan view of the motherboard and the electrical connections thereon but with the transfer switch rotary marker removed. However the drawing convention used in FIG. 5 differs from that of the other drawings in that components below the motherboard are shown in solid lines and components above the motherboard are shown in chain dot. (In the remaining Figures the usual convention is used so that components 'visible' to the viewer are shown in solid lines and components hidden from the viewer are shown as chain dotted or dotted)
Figure 23:
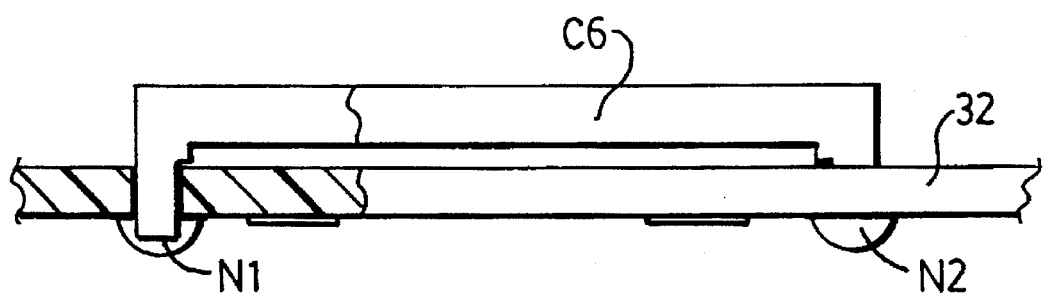
Figure 17:
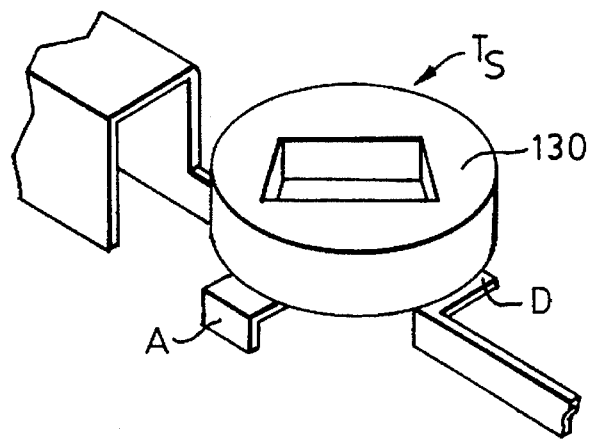
FIG. 17 is a perspective view of the transfer switch.
Figure 18:
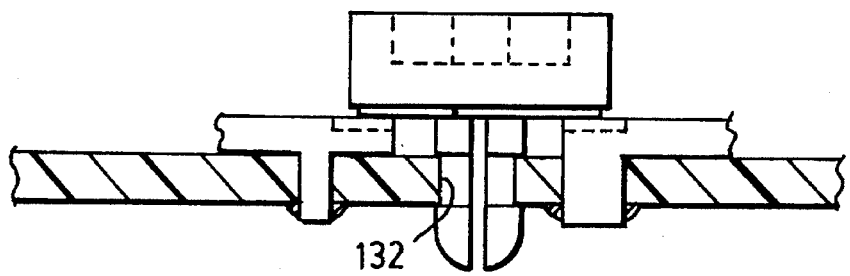
FIG. 18 is a sectional view of the transfer switch.

An elevated conductor C6 may be used as show in FIG. 23, between nodes N1 and N2 or N3 and N4 (FIG. 5). The elevated conductor provides an air barrier below and greatly reduces the dissipation of signal losses in the motherboard. The elevated conductor may be used with or without a condenser in the line. If the elevated conductor is used, the connector to the power coil may be soldered thereto, on the daughter board remote side of the condenser is used. An elevated conductor C1 may be used in place of any foil connected part of the RF circuit.

The daughter board mount 72 if an insulating block attached to the upper surface of the motherboard in any desired manner. The daughter board mount provides the seven upwardly projecting daughter board probes, numbered DB1 to DB7. The daughter board provides seven complementary downwardly facing sockets DS 1 to DS-7 in a downwardly open recess 74 preferably defined by the daughter board insulating material.

The daughter board material is a somewhat lossy insulating material similar to the motherboard and preferably is glass fibre insulating material similar to the motherboard.

Figure 16:
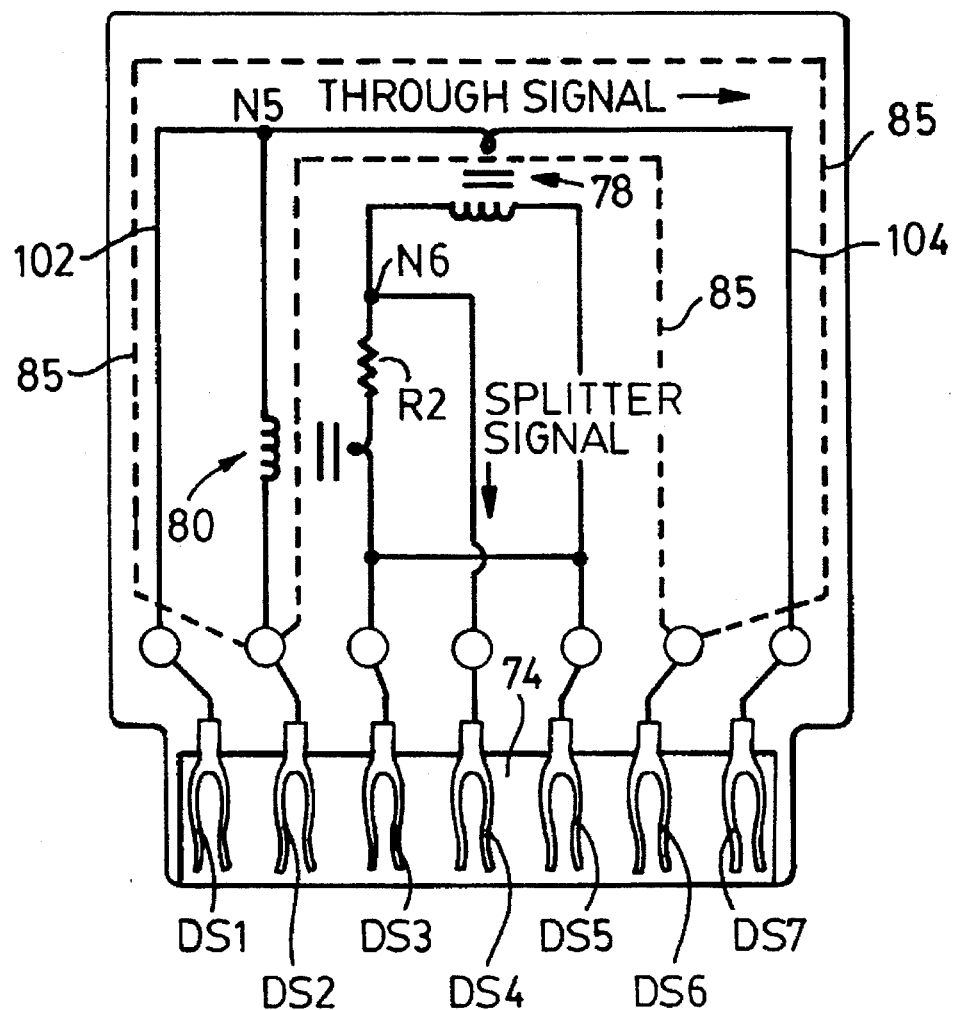
FIG. 16 shows the schematic arrangement of the daughter board directional coupler circuit.

FIG. 16 schematically illustrates the directional coupler circuit on the daughter board. The conductors shown on the front of the daughter board are preferably made of foil. Thus DS1 is electrically connected by line 102 to the input coil of a voltage transformer 78. The coil's other end is connected to DS7. DS2 is grounded on the motherboard and is connected to one side of the input coil of a current transformer 80 and the other side of the input coil is connected to line 102 at node N5 so that the input coil of current transformer 80 is in the series with the input coil of voltage transformer 78.

Socket DS3 is connected in series with the secondary of current transformer 80, a resistor R2 splitter node N6, the secondary of voltage transformer 78 to socket DS5. Socket DS3 is also connected to pin DS5. The splitter node N6 is connected to pin DS5. In operation the transformers are wired in a sense to give the desired splitter voltage at node N6 when the RF signal input is applied at DS1 (the main feed input terminal) and the RF signal output goes out over socket DS7 (the main feed output terminal). If the RF signal were input at DS7 and output at DS1 the splitter signal at splitter node N6 would be of no useful value. Hence if the RF signal were toward rather than away from the CP terminal the daughter board must be reversed relative to the motherboard.

Thus, before reversals with the RF signal coming from the common port CP the splitter will be oriented as shown in FIG. 16 and probes DB1–DB7 connected respectively to DS1 to DS7. After reversal with the signal going to the common port CP the daughter board is reversed from that shown and probes DB1–DB7 connected respectively to DS7 to DS1 so that the coupler input signal is travelling into the coupler circuit from DS7 to DS1 and the coupler output signal is travelling out of the coupler circuit from DS7 to DB1. It will be noted that in either position DB4 is connected to DS4 to carry the splitter output of the coupler circuit along line 82 to the splitter interface central conductor terminal 90 on the motherboard.

The daughter board on the other side forms the circuitry described with foil within the bounds of dotted lines 85 behind the lines from DS1 and DS2, behind the line from DS7 and behind the line containing node N5 and the input of voltage transformer 78. The foil within dotted line 84' is connected to daughter board sockets DS2 and DS6.

(In FIG. 5 the view is from the top of the motherboard. However in this Figure only the components on the top of the motherboard are shown in chain dots and the foil on the bottom of the motherboard is shown solid.)

With the foil on the back of the daughter board, connected to terminals DS2 and DS6, these are connected respectively to DB2 and DB6 for RF signal from port CP; or respectively connected to DB6 and DB2 for RF signal to port CP.

FIGS. 5, 6 and 7 show that DB2 and DB6 are connected by foil on the back of the motherboard. The foil patterns on the back of the motherboard have RF path connections shaded as sloping upward and to the left and ground connections shaded to slope upward and to the right. The RF path connections have been elsewhere discussed.

The ground planes are two. Ground plane GP1 is connected to platform bosses PB-8 and PB-1 and approaches closely to the RF paths to or from terminals 38 at the CP arid PP ports. The edge of GP1 closely accompanies the RF path between PB1 and daughter board probe DB2 and the RF path between DB6 and C2, on both sides, with a strip going to ground at boss PB7. From PB7 the edge of GP1 accompanies the RF path between transfer switch terminal B, toward transfer switch terminal A and curves over to form an edge adjacent the RF terminal at the pedestal port and to ground at PB-8. The ground plate GP1 has provided what might be called a 'ground current path' closely spaced from substantial extents of the RF path and an approximate attempt is made to approximate the characteristic resistance, usually 75 ohms, between these points. Thus the ground plane GP1 acts in the place of the outer conductor of a transmission line and 'organizes' the ground currents accordingly. This reduces the effects of housing: standing waves summation and reflections on the RF path and obviates the necessity of a coaxial cable inside the housing, so that the terminals 38 may be directly connected to coaxial cable pins at the CP and AP ports. The ground plane GP1 shields and lessens the effect of the ground currents associated with the RF line from those associated with the coupler both in the vicinity of the daughter board support and between the transfer switch and the splitter interface terminal 62. Lessening the effect of RF through line signals on the coupler and splitter signals is of considerable importance since substantial attenuation of the coupler and splitter signals, relative to the RF through path signals, means that in case of interaction of the signals, the latter may seriously, affect the quality of the former.

Ground plane GP2 also of conducting foil on the bottom of the motherboard further contributes to the isolation of the coupler output along foil line 84. Ground plane GP2 includes a path between probes DB3 and DB5 which passes between probes DB4, the coupler output and GP1. Thus the ground currents on GP1 and GP2 may slightly interact but each protects a signal path. GP1 protects the signals on the RF through path and GP2 protects the coupler output. Accordingly GP2 includes an edge 90' (FIG. 7) facing the coupler path 84 between probe DB4 and the central conductor 90 at the splitter interface. Edge 90' defines the ground plane GP2 and is grounded at platform boss PB2. GP2 has extents 92 and 94 located on each side of splitter interface terminal 90 and are mechanically shaped and mounted on the motherboard to make connection with the outer conductor 65 of the splitter interface. Again the ground plane GP2 is located to follow the coupler signal from probe DB4 to the splitter interface conductor 90 with the characteristic impedance therebetween but connects to the outer conductor 65 of the interface thus the ground currents in GP2 adjacent conductor 90 and the splitter central conductor have impedance approximately of the characteristic value therebetween, but the splitter central and outside conductors will respectively connect their splitter signals and ground current connections in a similar relationship to grounding connections and signal destinations in the splitter.

The ground currents in ground planes GP1 and GP2 are connected to the housing where shown. Because the currents in the ground planes follow their respective signal paths the consequential currents in the housing and its impedances and potential standing waves have a much lessened effect on the RF through line or coupler signal paths than with prior devices.

Connections from the ground planes to the housing are preferably made at intervals less than half the wavelength of the highest RF frequency encountered so that harmonics and standing waves arising in the housing will not have significant interaction with the RF signals.

It has sometimes been found that losses due to standing wave interaction are reduced if GP1 and GP2 are connected over the semicircular arc TZ shown in FIGS. 5, 6 and 7, as separating them. Even with such connection at TZ, currents over TZ do not substantially interfere with the ability of GP1 and GP2 to interact with the respective (through and splitter interface) signal paths.

As noted a bypass circuit is provided to maintain the signal path on the RF through line when the daughter board is removed. This maintains service to 'downstream' housings and subscribers at times when the daughter board is removed for repair or replacement. Spring connectors 90" and 92 are electrically connected by bypass BP.

Mounted on the motherboard is the daughter board bracket 72. Extending through the motherboard and connected by solder thereto are upstanding flat spring connectors 90" and 92 each mounted outwardly of the daughter board probes DB1 and DB7 and bent in the direction permitted by the springs' flatwise shape, to achieve contact with respective daughter board probes DB1 and DB7 in the absence of the daughter board. The sloping spring ends 94' and 96 are also designed to be deflected out of contact with their respective probes by the daughter board socket wall 98 when in the downward location of the daughter board.

Figure 14:
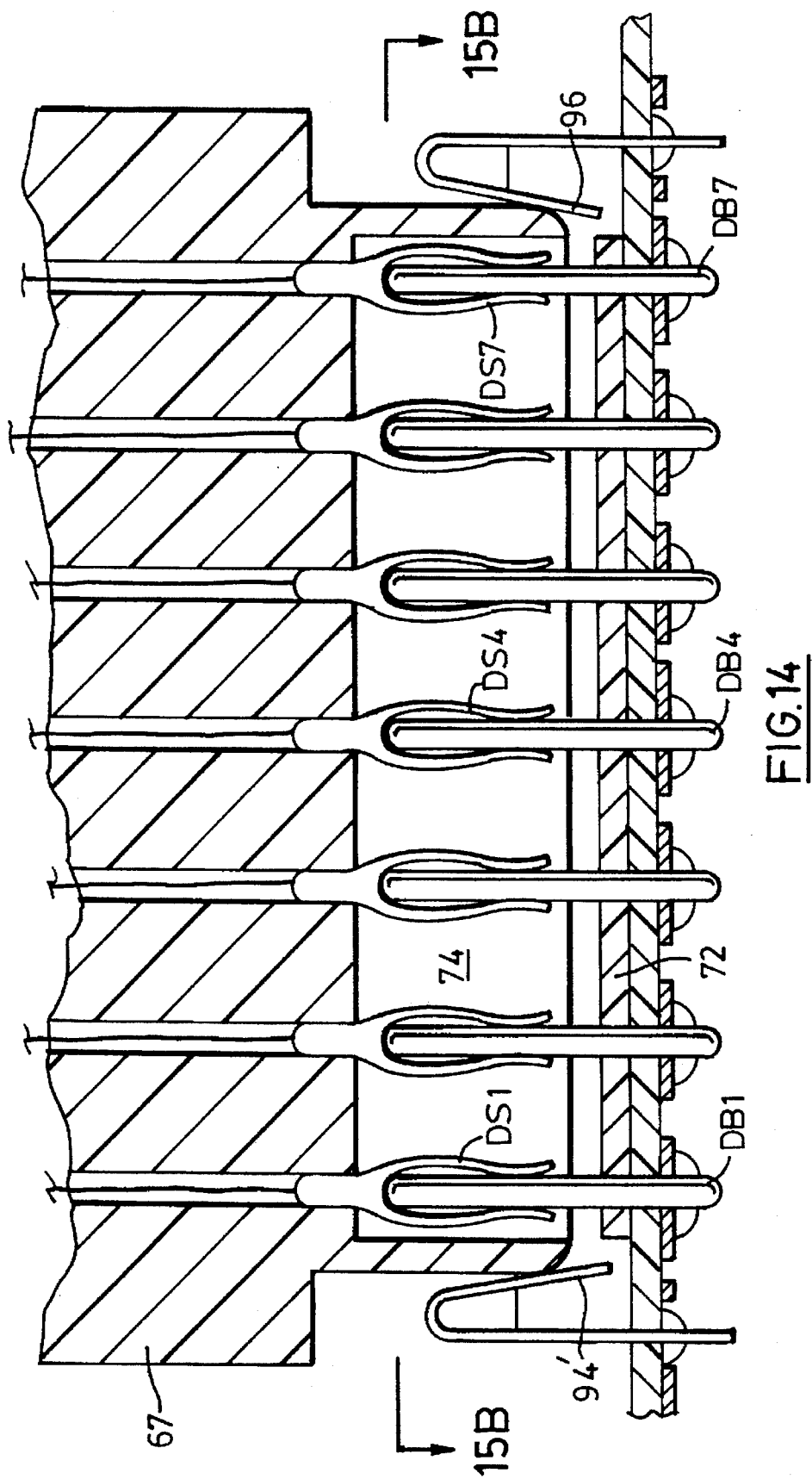

It is of some importance to note that, preferably, the connection of probes DB1 and DB7 (and preferably the rest of the probes) with the corresponding daughter board sockets takes place at a higher point in the relative travel of the daughter board relative to the motherboard, than the connect-disconnect point between the probes and the flat springs. Thus FIG. 14 shows the daughter board probes DB1–DB7 fully inserted in daughter board sockets DS1–DS7. Thus in FIG. 14, it is noted that the socket wall 98 maintains spring ends 94' and 96 out of electrical contact with probes DB1 and DB7, respectively.

On the other hand, FIG. 13 shows the daughter board displaced from fully assembled position to a relative location where wall 98 has allowed spring ends 94 and 96 to make respective electrical contact with probes DB1 and DB7 while the DB probes are each in contact with the corresponding DS sockets.

Thus when the daughter board sockets fully receive the motherboard probes (FIG. 14) the spring ends 94' and 96 are disconnected from the motherboard probes and the bypass BD is therefore open. The RF through path between foil extent F1 and foil extent F2, is connected through lines 102 and 104 of the coupler circuit (FIG. 16).

As the daughter board is progressively raised relative to the motherboard probes FIGS. 13, 14, 15A and 15C the spring contacts first contact the daughter board probes DB1 and DB7 (FIG. 13) and the bypass BP is connected between F1 and F2 before connection is broken to the daughter board forks. At a higher level the sockets DS1–DS7 disconnect from the daughter board probes DS1–DS7. The RF through line between the CP terminal and the transfer switch terminal A is then completed over the bypass BP before the connection over the coupler lines 102 and 104 is broken.

If the daughter board or its replacement is then lowered into position, the daughter board sockets are first connected to the motherboard probes (FIG. 13) and later the spring ends 94' and 96 are disconnected. The RF through line is thus connected over the coupler input circuit lines 102 and 104 FIG. 16 before the bypass BP disconnected. Thus removal or replacement of the daughter board was achieved without interrupting the RF through path to downstream equipment or subscribers.

Thus on either the connection or disconnection of the daughter board between the terminal and the transfer switch, one of the alternate connections between these points is completed before the other is broken. This make-before-break mode of operation acts to maintain through RF service to the downstream users of the RF during connection, disconnection of and the existence of the disconnected state of the daughter board. Thus the work on the subject equipment does not interrupt the service to downstream subscribers.

The make-before-break quality of the switch bypass circuitry renders it valuable, not only with the circuitry and components described herein but in other circuits where: a disconnectable component and an RF line and a potential bypass therefore while it is disconnected, are provided.

The line 106 to one end of the power coil is connected to node N1 and hence to the CP terminal. The line 108 from the other end of the power coil is connected to node N4 and hence to terminal A of the transfer switch and to probe 7 of the daughter board mounting block. The ends of the lines are customarily soldered or welded to the respective nodes N7, N8.

If the RF lines N3 to N4 and N1 to N2 are provided with capacitors (C1 and C2) the power coil lines are connected to the lines N3–N4 and N1–N2 on the sides of the capacitors C1 or C2 remote from the daughter board.

The AC coil by its nature (primarily its high inductance) and by its design, allows only a negligible amount of RF from the RF through line to pass through. The coupler circuit by its nature and design is arranged to allow only a small and controllable amount of AC power through the coupler circuit. If there is a risk that too much AC will reach the coupler circuit then capacitors C1 and C2 with a very high impedance to AC may be used. It is noted that if capacitors C1 and C2 are not used in the connections between N1–N2 and N3–N4 then the bypass circuit when connected will short out the power coil. Thus a capacitor (not shown) in line BP will be required to avoid this.

The splitter interface circuit 112 is mounted on the motherboard and its central conductor connection 90 appears herein as an anchor point in FIGS. 5,6,7 connectable to the central conductor to the splitter while the four raised walls 65 (FIG. 3) are conducting connectable as the outer conductor of the interface for connection to the outer conductor of the splitter (not shown). Thus splitter center conductor connection point 90 is connected by foil 84 on the back of the motherboard (FIG. 5) to the probe DB4 of the daughter board bracket and is not connected to the ground plane GP2. However the outer conductor 65 is connected at anchor points 118, to the ground plane GP2. As previously noted the ground plane GP2 edge is contoured relative to the foil conductor 84 from probe DB4 (and on both sides thereof) to the splitter connection point 90 to provide approximately the characteristic impedance between GP2 and conductor 84.

GP2 is connected to the busing at PB2. GP2 may also be connected to GP1 where the motherboard at the daughterboard connection to control ground plane resources.

The foil of GP2 thus provides a conductor for ground current consequential on the RF coupler output signal on conducting path 84, approaching the effect of having an outer 'coaxial' conductor for path 84. Excitation of unwanted currents in the housing is thus greatly reduced and signal strength less attenuated. The coupler output on path 84 is also shielded by GP2 from large effects due to RF signals on the RF through path.

The splitter (not described herein) is designed to provide an outer conductor 65 connectable to a similar outer conductor on the splitter and there will be a central splitter conductor to the splitter anchor point to carry the RF signal at 90 from the coupler output to the splitter input. The splitter and its connection to the secondary or 'F' taps are not further described herein as these may be provided in many forms well known to those skilled in the art. The splitter interface circuit may be embodied in other ways easily available to those skilled in the art. The relationship of GP2 to path 84 from the coupler tap output to splitter interface central conductor 90 is part of a facet of this invention.

The transfer switch (FIGS. 6, 7, and 17–20) comprises four stationary terminals A, B, C, D lettered clockwise and at 90° azimuth angles about their centre. Terminal A is connected to F3 and the RF circuit as before described. Terminal B in the long housing is connected to the central conductor of an air line 122, to be described. (In the short housing which is of a more square shape terminal B will be connected to the aerial terminal as previously noted).

Terminal C is connected to the outer connection of the air line through a resistor R4 (FIG. 5) having the characteristic impedance of the air line. Terminal D is connected to the terminal 38P for port PP at anchor point 127 (FIG. 6).

As will be noted from FIGS. 17–20 each of terminals A, B, C, D is separately anchored to the motherboard. Terminals A, B, C, and D are spaced from the RF ground plane GP1. Terminal C is of course connected thereto through resistor R4.

The RF ground plane GP1 is connected to both the inside and outside surfaces of outer air line conductor 124 at 126.

The rotary transfer switch is provided with a keying slot 130 (FIG. 17) so that the transfer switch may be operated by a suitable tool. The switch is also provided with a split spline which is grooved at 132 (FIG. 18) to be snapped into and receive the motherboard. The transfer switch has two positions and is provided with parallel opposed conducting bars (B1 and B2 (FIG. 6, 19 and 20 on its lower side to connect respective contacts joining opposite sides of the square defined by A, B, C, D. Thus with reversible 90° rotations (set by click-over mechanism, not shown) the switch will connect A to B and C to D at one position and connect D to A and B to C at the other position. In the FIG. 20, the switch is connecting A (the power coil and RF through circuit) to the centre conductor 122 of the troughline and (C to D) the terminal 38P of pedestal port PP to resistance R4 to ground. The connection to ground is shown as through ground plane GP1 from node N9 to the adjacent housing connection PB7 (FIG. 5).

Figure 21:
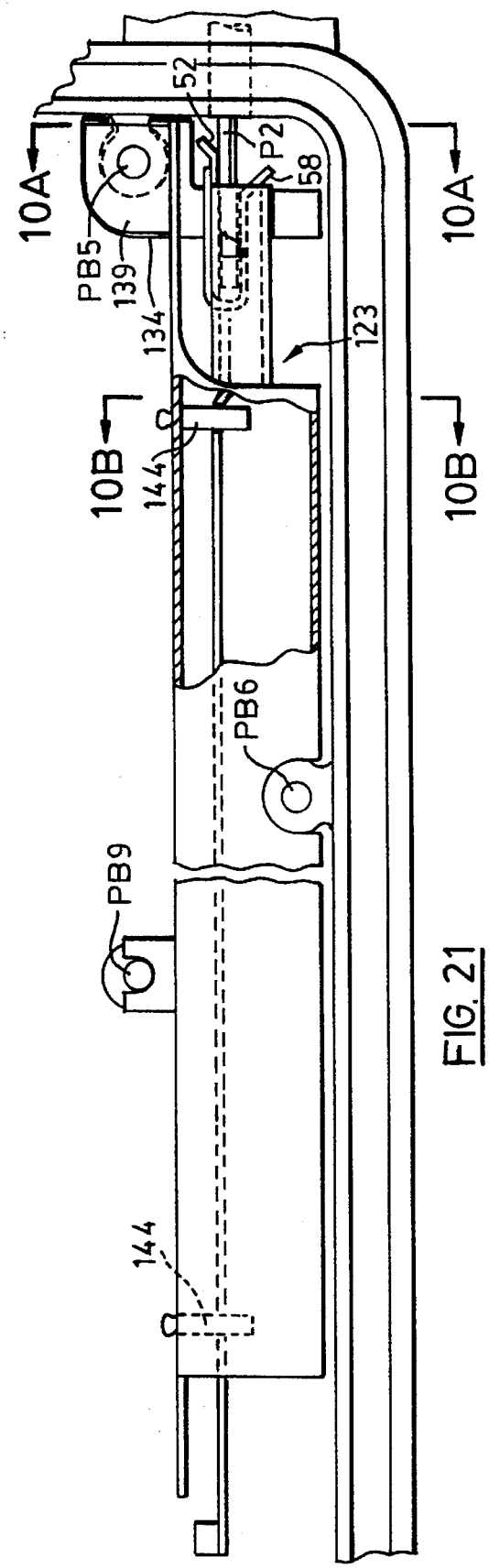
FIG. 21 is a partially schematic view of the trough line.

The air line or trough line outer conductor 124 is preferably in the form of an inverted U and may be cut away as at 123 (FIG. 21) for mounting purposes. The outer conductor is mounted on the housing by bolts, preferably at points spaced less than ½ the wavelength at the highest RF frequency encountered to reduce the risk of effect, of the generation in the housing or air line of standing waves or harmonics, on the signal transmitted along the central conductor or surface of 124, the outer conductor 124 is also connected to the RF ground plane at: PB4, PB5, PB6, PB7,PB9—see FIG. 7.

The central conductor 122 of the air line is preferably of the shape of a flat bar and substantially parallel to the side walls of outer conductor 124 along its length (FIG. 21, 22 10A and 10B). Outer conductor 124 and inner conductor 122 are oriented so that their free end edges face the bottom housing wall (FIG. 10B). These could equally well face the adjacent side housing wall. The transmission line just described and herein preferred is often known as a trough line.

(Another transmission line shape could be used. For example the ordinary coaxial conductor could be used. However more losses could be encountered because solid lossy dielectric supports of the central conductor cause more losses in the RF signal than with the 'air dielectric' available with the trough line). For other variants or possible transmission lines which could be used, see for example 'Microwave Engineering' by A. F. Harvey, Academic Press, London and New York.

In the preferred air line in accord with the invention the the outer conductor is inverted with its edges directed downwardly to have minimal RF interaction with the splitter circuit (not shown) but which will be mounted on the lid of the housing. The outer conductor is connected to the housing at bosses (FIG. 7) spaced at less than ½ wavelength of the highest frequency for which the system is designed. The outer air line conductor 124, adjacent the AP port is provided with an out-turned flange 134 (FIGS. 10A, 4) arranged to be spaced from the bottom wall of the housing. The out-turned flange is apertured as shown. Adjacent this area, is boss PB5.

A plastic block 139 (FIG. 10A) is provided apertured at one side to seat about boss PB5 and provided with a surface to support the out-turned flange 134 whose aperture also receives the boss PB5.

Figure 19:
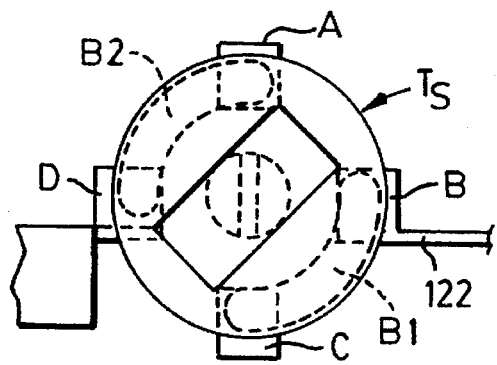
FIGS. 19 and 20 are top views of the transfer switch, indicating its positioning for pedestal and aerial mount respectively.
Figure 20:
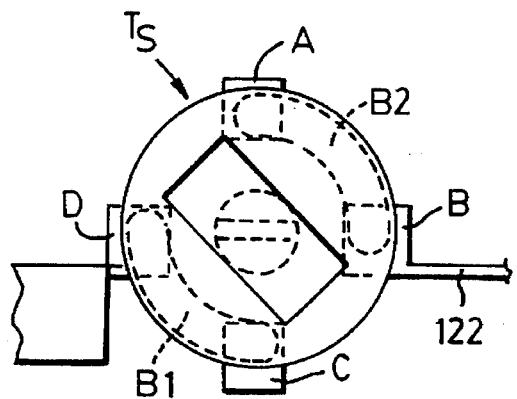
Figure 22:
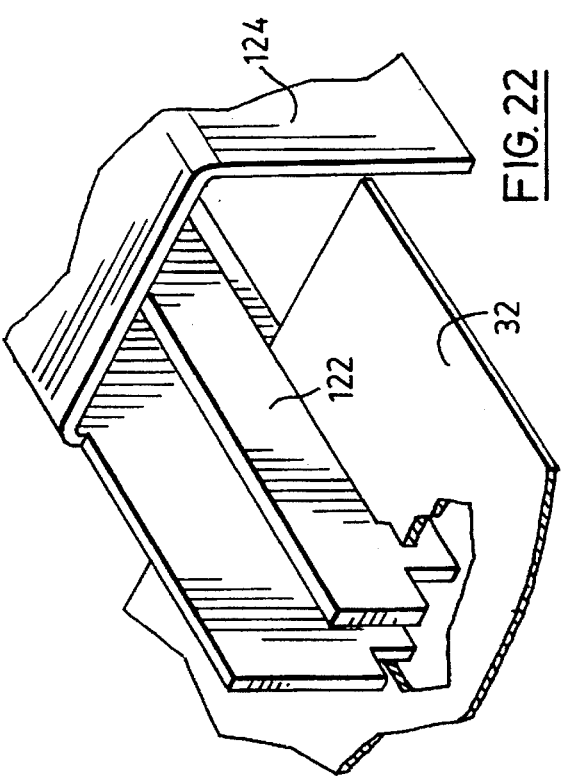
FIG. 22 is a perspective view of the outline of the trough line, FIG. 23 demonstrates an alternative construction for conductors on the motherboard.

The plastic block 139 extends below the out-turned flange to a location below the inner and outer conductors. Parallel grooves 142 are located in the plastic block, which receives the downward facing edges of the terminal bracket 38A which is in the form of FIG. 8C and thus support the inner conductor, which at its right hand end is welded to the side wall of terminal bracket 38A. Also adjacent the right hand end a plastic peg 144 is snapped into the side wall of outer conductor 124, as shown and receives the inner conductor 122 as a snap fit in its jaws 146. The left hand end of the inner conductor is attached to the motherboard (FIG. 22) and shaped to form terminal B of the transfer switch. (FIGS. 19 and 20). The outer conductor 124 is attached to the motherboard (FIG. 22). At the motherboard, conductors 122 and 124 are shown as connected to different electrical circuits, (FIG. 5). Conductor 122 continues the RF circuit from terminal B (if connected) to terminal 38A to which it is welded. Conductor 124 is connected at node N9 to GP1. It is noted that both the inside surface and the outside surface of outer conductor 124 are connected to GP1.

A second plastic peg 144 (FIG. 21) may connect the central and outer conductors near the motherboard although this may be thought unnecessary.

It will thus be seen that an air dielectric is provided between the inner and outer air line conductors 122 and 124 between the end supports for inner conductor 122 at plastic block 139.

With the long housing then, the motherboard 32 and trough line 122, 124 form a physically unitary platform which may be lifted out and into the housing as a unit, and without disconnecting or touching the coaxial cable connections. To remove the platform the following steps occur. The two terminals in use (FIG. 7) will be CP terminal 38C and AP terminal 38A (aerial connection) or CP terminal 38C and PP terminal 38P (pedestal connection). The keys (FIG. 11A–12C) for the terminals in use are turned to move the clip 56 in each out of seizure of the coaxial cable pin. The bolts for platform bosses PB1–PB9 are removed. The platform may then be simply lifted out.

To attach a platform, comprising motherboard 32 and trough line 122, 124 in the housing, the relevant terminals 38C and one of 38A or 38P are spread by key 60 so that the contact surfaces are spread wider than the corresponding coaxial cable pins P2 and the platform set in place so that the contact surfaces 56, 57 straddle the relevant coaxial cable pins P2. The platform is then mounted by inserting the bolts in the platform mounting bosses PB1–PB9. With the platform bolted in place, the spreader keys are rotated to inactive position allowing the contact surface of the contact members 57, 58 to seize the pins.

It will be noted that, a platform may be mounted in the housing, or withdrawn from and replaced in the housing without the necessity of disconnecting the coaxial cables and pins.

With a platform in place, if it is desired to remove an attached coaxial cable, it is merely necessary to screw off the exterior conductor attachment, as is well known in the art, and withdraw the coaxial cable. The coaxial pin slides out from between the contact surfaces 57, 58 which, under their bias move to rest position, as shown in FIG. 11C.

If it is desired to attach a coaxial cable, with the platform in place, the exterior conductor of the coaxial cable is attached in a manner well known to those skilled in the art, drawing the projecting pin inside the housing wall. The entering pin separates the contact guide surfaces of members 56, 57 against the bias of clip 56 and establishes electrical contact therewith.

It will be noted that, disconnection of a coaxial cable from or connection of a coaxial cable to the housing, may be performed without any manipulation of the platform and, indeed, without removing the lid 17 from housing.

If it is desired to convert a housing from use in a pedestal mounting to use in an aerial mounting, the coaxial cable is detached from ports PP and CP and the housing from the pedestal frame 28. The transfer switch is changed from its setting connecting terminals D–A to that connecting ports A–B (FIGS. 19 and 20). The housing may then be mounted on its aerial mount and coaxial cables attached at ports AP and CP.

To convert a housing from use in an aerial to use in a pedestal mount, the above procedure is reversed.

If, whether intended for pedestal or aerial mounting, the RF signal direction along the RF through line is reversed, the daughter board containing the coupler circuit is reversed so that the former daughter board connection DS1–DS7 to respectively DB1–DB7, is reversed, so that DS7–DS1 is respectively connected to DB1–DB7. It will be noted that this is the only change which need be made, the coupler output from DB4 to splitter interface terminal 90 being unchanged for either orientation of the daughter board. No change need be made in the motherboard or in-housing transmission (trough) line 122, 124 and, on the subscriber's side, (not shown) no change need be made in the splitter or secondary tap circuitry.

Where it is desired to use a shorter housing this will assume a generally square shape and the in-housing transmission line will be eliminated and the aerial port terminal placed on the motherboard and connected directly to transfer switch terminal B.

The shielding and ground current management is reviewed as follows: An RF signal entering the housing at pin P2 at the common port CP enters the housing at terminal 38C and travels as described to probe DB1. The outer conductor of the coaxial cable accompanying P1 is electrically (and mechanically) connected to the housing at port CP. Ground plate GP1 is grounded to the housing at PB1 (as close to port CP as practical) for minimum housing conduction of the ground current. Edge E1 of GP1 thus 'accompanies' closely the RF path to the daughter board probe DB2. If the daughter board is in place, the RF signal at probe DB1, travels on lines 102 and 104 to probe DB7. The RF signal on the daughter board is accompanied by foil 85 which accompanies lines 102 and 104 and foil 85 connects probes DB2 and DB6. Thus the RF signal to probe DB7 is accompanied by foil 85 which forms a continuation of GP1 across the daughter board. (It is noted that, at the same time edge E2 of GP1 is spaced from edge C2 of ground plane GP2). As the RF signal exits the daughter board probe at DB7, edge E3 of GP1 accompanies foil F2. Foil of GP1 accompanies the RF path from C2 paralleling F3 to transfer switch paths A–B to connect to trough line outer conductor 124 and from there to aerial port AP where the conductor 124 connects to the housing at PB5 which is as close as practical to the connection between the AP outer conductor of the coaxial cable and the housing. Thus an RF signal from port CP to port AP is accompanied by a ground current path over GP1 and conductor 124.

Another limb of GP1 connects at PB1 as closely as practical to the housing where an outer cable would be connected at port PP.

Thus the ground plane acts as an extension of the outer distribution conductors connected at CP and AP or CP and PP. The impedance between the RF signal path and its accompanying portion or edge of ground plane GP1 may be as close to the characteristic impedance to reduce RF signal losses. The ground plane GP1 thus reduces the interaction between the RF signal and the housing.

The interaction of the RF signal with the housing is further reduced by maintaining the housing lengths where the housing does form a part of the ground current path as short as possible. Such housing lengths are: From the distribution cable outer conductor at port CP to PB1, from an outer conductor at PP to PB8 and from the outer conductor at AP to PB5.

The above benefits hold true if the RF path so the signal is going from AP or PP to CP, with the daughter board reversed.

The ground plane GP1 also shields the currents in the coupler splitter path 84 from signals on the through path.

Ground plane GP2 similarly accompanies the path at approximately characteristic impedance thereto from probe DB4 to splitter interface terminal 90. GP2 similarly continues the ground current path at (about) the characteristic impedance from the daughter board circuit over probes DB3 and DB5 to nodes 118 where they connect to the outer conductor 65 of the splitter interface to continue the ground current path. GP2 is also connected to the housing at PB2, and may be joined to GP1 on the motherboard adjacent the motherboard socket to dissipate standing waves which tend to form on the foil, ground planes.

We claim:

1. A combination for use with a coaxial cable distribution network, including:
   a conducting housing having opposed ends with a first port at one end and at least a second port at the same or at an opposite end,
   a first insulating plate mounted in said housing,
   an RF circuit, including an electrically reversible through path, supported on said first plate, said through path, having two ends,
   means for connecting one of said ends to the center conductor of a coaxial cable at one of said ports,
   means for connecting the other of said ends to the center conductor of a coaxial cable at another of said ports,
   wherein the RF through path is connected to coupler circuitry,
   located on a second insulating plate,
   and wherein said coupler circuitry is directional and said second insulating plate is mechanically and electrically reversible relative to said RF through path.

2. A combination as claimed in claim 1 wherein a ground plane is located on said second insulating plate.

3. A combination for use in a coaxial cable network,
   a conducting housing having at least two ports,
   a first plate of insulating material mounted on said housing,
   means defining an electrically reversible RF through path on said first plate,
   means for connecting one end of said RF path to the center conductor of a coaxial cable located at one of said ports,
   means for connecting the other end of said RF path to the central conductor of a coaxial cable located at another of said ports,
   wherein the RF through path is connected to coupler circuitry,
   wherein the coupler is located on a second insulating plate which is mechanically and electrically detachably mounted on said first insulating plate,
   and wherein said coupler circuitry is directional and said second insulating plate is mechanically and electrically reversible relative to said RF through path.

4. A combination for use with a coaxial cable distribution network, including:
   a conducting housing having opposed ends with a first port at one end and at least a second port at the same or at an opposite end,
   a first insulating plate mounted in said housing,
   an RF circuit, including a through path, supported on said first plate, said through path, having two ends,
   means for connecting one of said ends to the center conductor of a coaxial cable at one of said ports,
   means for connecting the other of said ends to the center conductor of a coaxial cable at another of said ports,
   wherein the RF through path is connected to coupler circuitry,
   located on a second insulating plate,
   and wherein a conducting ground plane is located on said first insulating plate, spaced from but in electrical proximity to said RF through line said ground plane being connected to said housing adjacent each of said ports.

5. A combination as claimed in claim 4 wherein a second ground plane is located on said second insulating plate.

6. A combination for use in a coaxial cable network,
   a conducting housing having at least two ports,
   a first plate of insulating material mounted on said housing,
   means defining an RF through path on said first plate,
   means for connecting one end of said RF path to the center conductor of a coaxial cable located at one of said ports,
   means for connecting the other end of said RF path to the central conductor of a coaxial cable located at another of said ports,
   wherein the RF through path is connected to coupler circuitry,
   wherein the coupler is located on a second insulating plate which is mechanically and electrically detachably mounted on said first insulating plate,
   wherein a first ground plane is located on said first insulating plate, spaced from but in electrical proximity to said RF through line, said first ground plane being connected to said housing adjacent each of said ports.

7. A combination as claimed in claim 6 wherein said second insulating plate carries a second ground plane connected to a third ground plane on said first insulating plane and said first and third ground plane occupy different areas on said first plate.

8. A combination as claimed in claim 7 wherein said first and third ground planes are electrically connected.

9. A combination for use in a coaxial cable distribution network,
   a conducting housing having opposed walls,
   a first port located in one of said opposed walls,
   a second port located in said one, or the other, opposed wall,
   a plate of insulating material mounted in said housing,
   means defining an RF through path on said first plate,
   means for connecting one end of said RF through path to the center conductor of a coaxial cable located at said first port,
   means for connecting the other end of said RF through path to the center conductor of a coaxial cable located at said second port, a ground plane on said plate electrically connected to said housing adjacent said first port and electrically connected to said housing adjacent said second port.

10. A combination for use in a coaxial cable distribution network:

a conducting housing having at one end common and pedestal ports and at the other end an aerial port, a lid for said housing, a plate of insulating material having an RF path, said RF path from said common port connected at one end to a first terminal at a transfer switch, first means for connecting the other end of said RF path to the central conductor of a coaxial cable at said common port, second means for connecting a second terminal of said transfer switch to the central conductor of a coaxial cable at said pedestal port and third means for connecting a third terminal of said transfer switch to the central conductor of a coaxial cable at said aerial port, said transfer switch having two positions being a first position connecting said first to said second terminal and a second position connecting said first to said third terminal.

11. A combination as claimed in claim 10 wherein the signal conductor of an RF transmission line acts as part of said third means for connecting, and there is an outer conductor for said signal conductor.

12. A combination as claimed in claim 11 wherein said signal conductor and outer conductor are spaced by air over a majority of their length.

13. A combination as claimed in claim 11 wherein said signal conductor is a longitudinally extending strip and said outer conductor is U shaped in section over most of its length, wherein said U shaped section is on three sides of said strip.

14. A combination as claimed in claim 13 wherein said housing has bottom and side walls said strip has its long dimension, in section, approximately parallel to the uprights of said U and where said uprights have free edges which face the bottom or side walls of said housing.

15. A combination as claimed in claim 13 wherein said signal and outer conductors are spaced by air over the majority of their length.

16. A combination for use in a coaxial cable distribution network, comprising:

a conducting housing having bottom and side walls and common and pedestal ports at one end of the conducting housing and an aerial port at an opposing end of the conducting housing, a first plate of insulating material having an RF through path thereon, mounted on said housing, means for connecting one end of said RF through path to the center conductor of a coaxial cable at said common port, means for alternatively connecting the other end of said RF through path to the center conductor of a coaxial cable at said pedestal port, or the center conductor of a coaxial cable at said aerial port, a first ground plane on one surface of said plate, electrically connected to a housing side wall adjacent said pedestal and common ports and connected also to a housing side wall adjacent said alternatively connecting means, the spacing of said ground plane from the RF through path which it accompanies providing that the impedance between the ground plane and adjacent portions of the RF path approximates a characteristic impedance.

17. A combination as claimed in claim 16 wherein said ground plane is generally contoured to follow said RF circuit across said plate.

18. A combination as claimed in claim 16 wherein a coupler is connectable to and disconnectable from said RF circuit.

19. A combination as claimed in claim 16 wherein said RF path includes the input portion of a coupler circuit.

20. A combination as claimed in claim 19 where said coupler circuit provides a splitter output at a location on said first plate.

21. A combination as claimed in claim 19 wherein a splitter is on a second insulating plate dismountably mounted on said first plate, a second ground plane is located on said second plate adjacent said input portion, means are provided on mounting of said second plate for connecting said input portion to said RF circuit and said second ground plane to said first ground plane.

22. A combination as claimed in claim 21 wherein said coupler circuit provides a splitter output connection to a location on said first plate, a splitter ground plane on said first plate, located, between said RF circuit; and said connection said splitter ground plane being connected to said housing.

23. A combination as claimed in claim 21 wherein the input portion of said coupler circuit is reversible relative to the remainder of said RF circuit.

24. A combination for use in a coaxial cable distribution network, comprising:

a conducting housing having bottom and side walls and having at one side wall a first port and at said same one wall or an opposed side wall a second port, a lid for said housing, each of said ports being connectable to the outer conductor of a coaxial cable thereat when a pin from the coaxial conductor projects into said housing, a first plate of insulating having an RF through path thereon, mounted on said housing, means for connecting one end of said RF path to said first port, means for connecting the other end of said RF through path to a pin at said second port, a ground plane on one surface of said plate electrically connected to a housing side wall adjacent said first port and connecting also to a housing side wall adjacent the connection of said other end of said RF path to said second port.

* * * * *